(12) United States Patent
Shuy

(10) Patent No.: US 7,800,898 B2
(45) Date of Patent: *Sep. 21, 2010

(54) HEAT EXCHANGE ENHANCEMENT

(75) Inventor: Geoffrey Wen-Tai Shuy, Ma On Shan (HK)

(73) Assignee: Hong Kong Applied Science and Technology Research Institute Co. Ltd., Hong Kong (HK)

( * ) Notice: Subject to any disclaimer, the term of this patent is extended or adjusted under 35 U.S.C. 154(b) by 84 days.

This patent is subject to a terminal disclaimer.

(21) Appl. No.: 12/057,811

(22) Filed: Mar. 28, 2008

(65) Prior Publication Data
US 2009/0084530 A1 Apr. 2, 2009

Related U.S. Application Data

(62) Division of application No. 11/396,364, filed on Mar. 31, 2006, now Pat. No. 7,440,280.

(51) Int. Cl.
*G06F 1/20* (2006.01)
*H05K 7/20* (2006.01)

(52) U.S. Cl. .............. 361/679.47; 361/679.52; 361/679.54; 361/690; 361/692; 361/700; 361/704; 361/707; 165/104.33; 165/185; 174/15.2; 174/16.1

(58) Field of Classification Search .......... 361/690, 361/692, 694–695, 697–700, 704, 717; 165/80.2–80.5, 165/104.33, 185; 174/15.2, 16.1, 16.3; 362/218, 362/294, 373, 547
See application file for complete search history.

(56) References Cited

U.S. PATENT DOCUMENTS 2,287,328 A 6/1942 Rose
3,783,347 A 1/1974 Vladik
4,359,086 A 11/1982 Sanborn et al.
4,505,326 A * 3/1985 Hazen .................. 165/45
4,733,335 A 3/1988 Serizawa et al.

(Continued)

FOREIGN PATENT DOCUMENTS

CN 1060924 5/1992

(Continued)

OTHER PUBLICATIONS

Bellettre, J. et al., "A new approach for the study of turbulent boundary layers with blowing," International Journal of Heat and Mass Transfer, 42:2905-2920 (1999).

(Continued)

*Primary Examiner*—Robert J Hoffberg
(74) *Attorney, Agent, or Firm*—Stuart T. Auvinen; gPatent LLC

(57) ABSTRACT

A heat exchange structure includes a plurality of elongated air ducts. The heat exchange structure has an exterior heat exchange surface and interior heat exchange surfaces, the interior surfaces being in the elongated air ducts. The heat exchange structure includes a plurality of heat generators that are distributed on the exterior heat exchange surface along an elongated direction of the air ducts, in which air flowing in the air duct is heated successively by heat from the heat generators, and air flow in the air duct is enhanced by buoyancy of heated air.

6 Claims, 17 Drawing Sheets

U.S. PATENT DOCUMENTS

| | | | |
|---|---|---|---|
| 4,734,835 A | 3/1988 | Vines et al. | |
| 4,746,479 A | 5/1988 | Hanaki et al. | |
| 4,749,975 A | 6/1988 | Tokita et al. | |
| 5,049,981 A | 9/1991 | Dahringer | |
| 5,200,241 A | 4/1993 | Nied et al. | |
| 5,213,153 A | 5/1993 | Itoh | |
| 5,218,516 A | 6/1993 | Collins et al. | |
| 5,276,584 A | 1/1994 | Collins et al. | |
| 5,892,278 A | 4/1999 | Horita et al. | |
| 5,977,694 A | 11/1999 | McGuire | |
| 6,082,444 A | 7/2000 | Harada et al. | |
| 6,289,888 B1 | 9/2001 | Welles | |
| 6,355,332 B1 | 3/2002 | Kobayashi | |
| 6,358,595 B1 | 3/2002 | Kobayashi | |
| 6,427,466 B1 | 8/2002 | Livni | |
| 6,478,082 B1* | 11/2002 | Li | 165/185 |
| 6,536,514 B1 | 3/2003 | Sugiyama et al. | |
| 6,568,465 B1 | 5/2003 | Meissner | |
| 6,573,536 B1 | 6/2003 | Dry | |
| 6,650,048 B2 | 11/2003 | Wu | |
| 6,815,724 B2* | 11/2004 | Dry | 257/88 |
| 6,831,303 B2 | 12/2004 | Dry | |
| 7,144,135 B2 | 12/2006 | Martin et al. | |
| 7,234,844 B2 | 6/2007 | Bolta et al. | |
| 7,242,028 B2 | 7/2007 | Dry | |
| 7,244,044 B2 | 7/2007 | Liao | |
| 7,288,796 B2* | 10/2007 | Dry | 257/88 |
| 7,290,913 B2 | 11/2007 | Watanabe et al. | |
| 7,300,187 B2 | 11/2007 | Huang | |
| 7,329,033 B2 | 2/2008 | Glovatsky et al. | |
| 7,378,163 B2 | 5/2008 | Loh et al. | |
| 7,427,152 B2 | 9/2008 | Erion et al. | |
| 7,434,964 B1* | 10/2008 | Zheng et al. | 362/294 |
| 7,440,280 B2* | 10/2008 | Shuy | 361/701 |
| 7,461,951 B2 | 12/2008 | Chou et al. | |
| 7,593,229 B2* | 9/2009 | Shuy | 361/705 |
| 7,595,120 B2* | 9/2009 | Loh et al. | 428/701 |
| 7,651,253 B2* | 1/2010 | Shuy | 362/547 |
| 2004/0108104 A1* | 6/2004 | Luo | 165/181 |
| 2005/0006065 A1 | 1/2005 | Katsumata et al. | |
| 2005/0098300 A1 | 5/2005 | Kawabata et al. | |
| 2005/0126766 A1 | 6/2005 | Lee et al. | |
| 2005/0233112 A1 | 10/2005 | Loh et al. | |
| 2007/0081340 A1 | 4/2007 | Chung et al. | |
| 2007/0091632 A1 | 4/2007 | Glovatsky et al. | |
| 2007/0230184 A1 | 10/2007 | Shuy | |
| 2007/0230185 A1 | 10/2007 | Shuy | |
| 2008/0007954 A1* | 1/2008 | Li | 362/294 |
| 2008/0055909 A1* | 3/2008 | Li | 362/294 |
| 2008/0173432 A1 | 7/2008 | Shuy | |
| 2008/0180955 A1 | 7/2008 | Shuy | |
| 2008/0180969 A1 | 7/2008 | Shuy | |
| 2008/0258598 A1 | 10/2008 | Shuy | |
| 2008/0283403 A1 | 11/2008 | Shuy | |
| 2008/0285298 A1 | 11/2008 | Shuy | |
| 2008/0286544 A1 | 11/2008 | Shuy | |
| 2009/0015125 A1 | 1/2009 | Shuy | |

FOREIGN PATENT DOCUMENTS

| | | |
|---|---|---|
| CN | 1393929 | 1/2003 |
| FR | 2862179 | 5/2005 |
| JP | 55061049 | 5/1980 |
| JP | 61-178487 | 8/1986 |
| JP | 6315265 | 11/1994 |
| JP | 63144697 | 6/1998 |
| JP | 2002195788 | 7/2002 |
| JP | 2004053167 | 2/2004 |
| JP | 2004063794 | 2/2004 |

OTHER PUBLICATIONS

Bellettre, J. et al., "Studies of the Transpiration Cooling Through a Sintered Stainless Steel Plate," Experimental Heat Transfer, 18:33-44, 2005.

Kim, Y. et al. "Transient mixed radiative convection flow of a micropolar fluid past a moving, semi-infinite vertical porous plate," International Journal of Heat and Mass Transfer 46:1751-1758, 2003.

Kuznetsov, A.V. et al., "Effects of Thermal Dispersion and Turbulence in Forced Convection in a Composite Parallel-Plate Channel: Investigation of Constant Wall Heat Flux and Constant Wall Temperature Cases," Numerical Heat Transfer, Part A, 42:365-383, 2002.

Wagner, C. et al., "DNS of turbulent flow along passively permeable walls," International Journal of Heat and Fluid Flow 21:489-498, 2000.

PCT International Search Report (PCT/CN2007/000967) mailed Jul. 5, 2007 (2 pages).

* cited by examiner

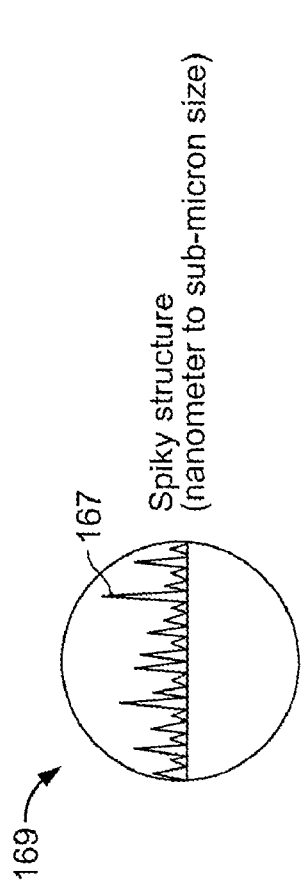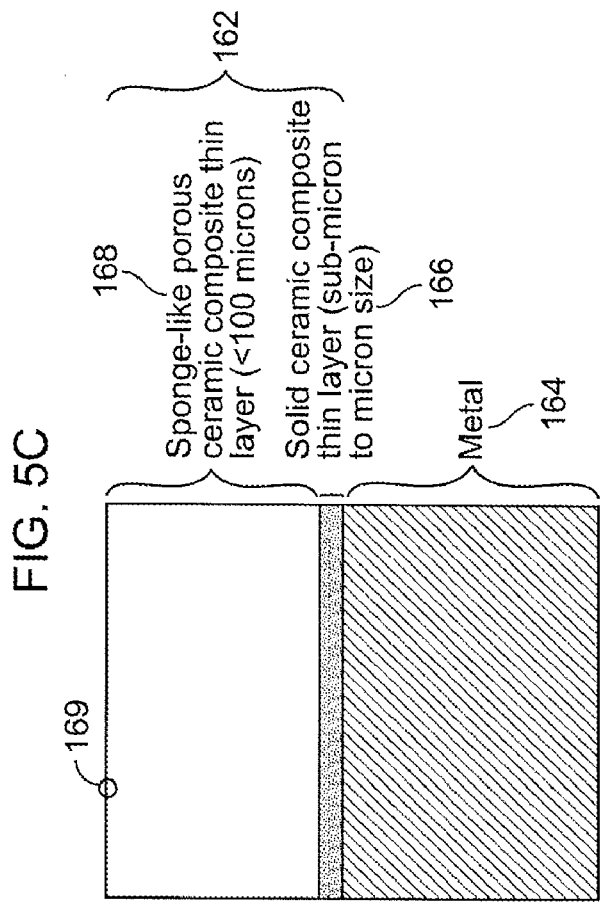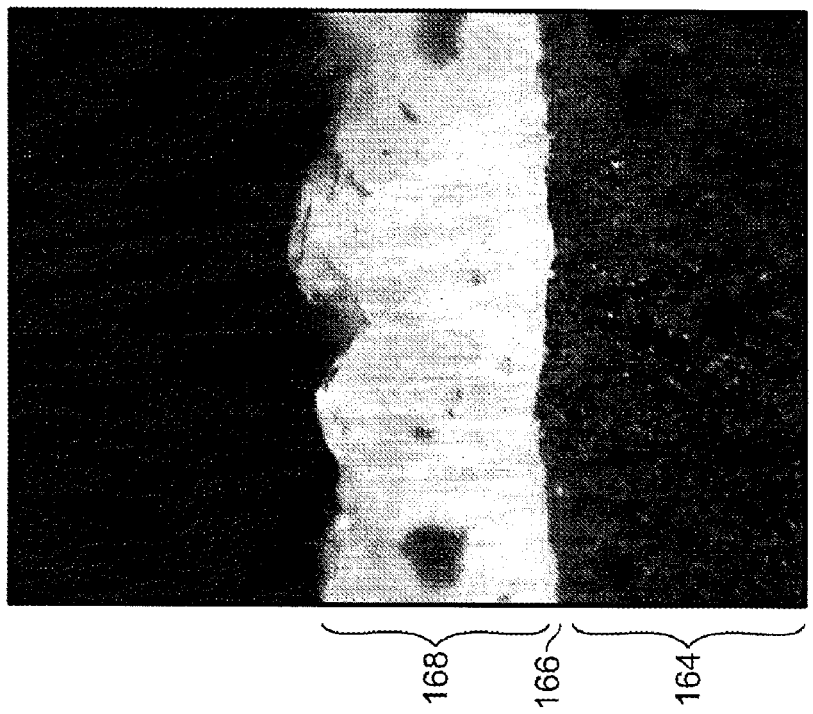
FIG. 5C
FIG. 5B
FIG. 5D

HEAT EXCHANGE ENHANCEMENT

CROSS-REFERENCE TO RELATED APPLICATIONS

This application is related to concurrently filed U.S. patent application Ser. No. 11/396,388, titled "Heat Exchange Enhancement" and Ser. No. 11/396,385, titled "Heat Exchange Enhancement", both of which are incorporated herein by reference. In addition, this application is a divisional of U.S. application Ser. No. 11/396,364, filed on Mar. 31, 2006. The entire contents of U.S. application Ser. No. 11/396,364 are hereby incorporated by reference.

BACKGROUND

This invention relates to heat exchange enhancement.

Electronic components often generate heat that has to be dissipated to the surrounding environment to prevent overheating. In some examples, the heat is dissipated to ambient air. A heat sink with a larger surface area can be used to enhance heat dissipation. Using a fan to increase air flow around the electronic component or the heat sink can enhance heat dissipation. Increasing the air-solid contact area (i.e., surface area) may also improve the heat dissipation. Another conventional wisdom is to spread the heat to the heat sink effectively (via good conduction or convection media or both) so as to increase the difference between the heat dissipation surface and the ambient air temperature, at the same time to reduce the temperature difference between the heat source and the dissipation surface.

SUMMARY

In a general aspect, air-solid heat exchange can be enhanced by increasing a heat exchange surface area of a heat conducting solid without blocking a natural air flow. Air ducts are provided to allow heated air to rise and exit the ducts through upper openings to carry away heat, at the same time allowing cool air to enter the ducts from lower openings and absorb heat from the walls of the air ducts. The air ducts can reduce weak linkages in thermal conduction and heat spreading. In some examples, fins are positioned in the ducts and aligned along the direction of air flow to increase the heat exchange surface without blocking the air flow. Heat exchange occurs along the length of the duct, causing hot air to continue to rise in the duct due to hot air buoyancy, creating a pumping effect to efficiently move air through the duct without the use of fans.

In another general aspect, the quality of heat exchange between a solid structural section and ambient air molecules can be enhanced by modifying a surface property (for example, surface potential) of the solid structural section, for example, by coating a thin layer of material on the solid structural section. The thin layer can be made of, for example, a ceramic material. The thin layer can have (a) spiky micro/nano structures, and/or (b) porous micro/nano structures, in which the spiky or porous structures (1) enhance the micro surface area, and (2) modify the solid surface potential of trapping/de-trapping (absorption & de-absorption) of air molecules for better heat transfer between the solid surface and ambient air.

The solid structural section may include a metal structural section. For example, the metal structural section may include at least one of aluminum, magnesium, titanium, zinc, and zirconium. For example, the structural section may include an alloy of at least two of aluminum, magnesium, titanium, zinc, and zirconium. The structural section may include a ceramic structural section. For example, the ceramic structural section may include one or more of aluminum oxide, aluminum nitride, titanium oxide, titanium nitride, zirconium oxide, and zirconium nitride. In some examples, the thin layer of ceramic material includes at least one of aluminum carbide, aluminum nitride, aluminum oxide, magnesium carbide, magnesium nitride, magnesium oxide, silicon carbide, silicon nitride, silicon oxide, titanium carbide, titanium nitride, titanium oxide, zinc carbide, zinc nitride, zinc oxide, zirconium carbide, zirconium oxide, and zirconium nitride. In some examples, the thin layer of ceramic material includes a combination of at least two of aluminum carbide, aluminum nitride, aluminum oxide, carbon, magnesium carbide, magnesium nitride, magnesium oxide, silicon carbide, silicon nitride, silicon oxide, titanium carbide, titanium nitride, titanium oxide, zirconium carbide, zirconium oxide, zirconium nitride, zinc carbide, zinc nitride, and zinc oxide.

In one aspect, in general, an apparatus includes a heat exchange structure includes a plurality of elongated air ducts, in which the heat exchange structure has an exterior heat exchange surface and interior heat exchange surfaces, the interior surfaces positioned in the elongated air ducts. The apparatus includes a plurality of heat generators that are distributed on the exterior heat exchange surface along an elongated direction of the air ducts, in which air flowing in the air duct is heated successively by heat from the heat generators, and air flow in the air duct is enhanced by buoyancy of heated air.

Implementations of the apparatus may include one or more of the following features. The heat generators include electronic devices. The electronic devices include light sources. The apparatus includes signal lines that are attached to the exterior heat exchange surface, the electronic devices being attached to the signal lines. The heat exchange structure includes a metal structural section, in which heat flows from the exterior heat exchange surface to the interior heat exchange surfaces through the metal structural section. The heat exchange structure includes a structural section and a thin layer of ceramic material attached to a surface of the structural section, the thin layer of material having a thickness less than 100 microns. The thin layer of ceramic material includes a first sub-layer that is substantially impermeable to air molecules and a second sub-layer that is at least partially permeable to air molecules. In some examples, the apparatus includes a fan to enhance air flow in the air ducts. In some examples, the apparatus is configured to operate without a fan.

In another aspect, in general, an apparatus for dissipating heat from electronic components includes a heat exchange structure that has an elongated air duct and an interior heat exchange surface positioned within the air duct. The apparatus includes signal lines coupled to an exterior heat exchange surface of the heat exchange structure, the signal lines defining locations for attaching the electronic components, the locations being disposed along an elongated direction of the air duct. The heat exchange structure is designed and configured to transfer heat from the electronic components through the exterior and interior heat exchange surfaces to air flowing in the air duct such that the air flowing in the air duct is heated successively by heat from the electronic components disposed along the elongated direction of the air duct, and air flow in the air duct is enhanced by buoyancy of heated air.

Implementations of the apparatus may include one or more of the following features. The heat exchange structure includes a composite substrate that includes a substrate and a thin layer of ceramic material attached to the substrate, the thin layer of ceramic material having a thickness less than 100 microns. In some examples, the apparatus includes a fan to enhance air flow in the air ducts. In some examples, the apparatus is configured to operate without a fan.

In another aspect, in general, an apparatus includes a vehicle lamp that has a heat exchange structure including a plurality of elongated air ducts, in which the air ducts include heat exchange surfaces configured to exchange thermal energy with air flowing in the air ducts. The apparatus includes light emitting diodes that are distributed along an elongated direction of the air ducts, in which the light emitting diodes are configured to transfer heat to the heat exchange surfaces in the air ducts to successively heat air as the air flows through the air ducts and enhance air flow in the air ducts by buoyancy of heated air. The vehicle lamp is configured to dissipate thermal energy generated by the light emitting diodes to the air flowing in the air ducts.

Implementations of the apparatus may include one or more of the following features. The heat exchange structure includes a structural section and a thin layer of ceramic material attached to the structural section, the thin layer of ceramic material having a thickness less than 100 µm. In some examples, the vehicle lamp includes a water-tight chamber enclosing the light sources. In some examples, the vehicle lamp includes two water-tight chambers connected by a passage, one of the chambers enclosing the light sources and the other of the chambers enclosing electronic components to control the light sources, the passage allowing signal lines to pass, the signal lines connecting the light sources to the electronic components.

In another aspect, in general, an apparatus includes a light source that has a plurality of light emitting diode modules. Each light emitting diode module includes a heat exchange structure including a plurality of elongated air ducts, in which the air ducts include heat exchange surfaces configured to exchange thermal energy with air flowing in the air ducts. The light source includes light emitting diodes that are distributed along an elongated direction of the air ducts, in which the light emitting diodes configured to transfer heat to the heat exchange surfaces in the air ducts to successively heat air as the air flows through the air ducts and enhance air flow in the air ducts by buoyancy of healed air. Each light emitting diode module is configured to dissipate thermal energy generated by the light emitting diodes to the air flowing in the air ducts.

Implementations of the apparatus may include one or more of the following features. The apparatus complies with MR-16 standard. The heat exchange structure includes a structural section and a thin layer of ceramic material attached to the structural section, the thin layer of ceramic material having a thickness less than 100 µm. In some examples, the light emitting diode modules are arranged such that the light emitting diodes of different light emitting diode modules face substantially the same direction. In some examples, the light emitting diode modules are arranged such that the light emitting diodes of different light emitting diode modules face different directions.

In another aspect, in general, an apparatus includes a wall wash light having a heat exchange structure that has a plurality of elongated air ducts, in which the air ducts include heat exchange surfaces configured to exchange thermal energy with air flowing in the air ducts. The apparatus includes light emitting diodes that are distributed along an elongated direction of the air ducts, in which the light emitting diodes are configured to transfer heat to the heat exchange surfaces in the air ducts and successively heat air as the air flows in the air ducts and enhance air flow in the air ducts by buoyancy of heated air. The wall wash light is configured to dissipate thermal energy generated by the light emitting diodes to the air flowing in the air ducts.

Implementations of the apparatus may include one or more of the following features. The heat exchange structure includes a structural section and a thin layer of ceramic material attached to the structural section, the thin layer of ceramic material having a thickness less than 100 µm.

In another aspect, in general, a method includes transferring thermal energy from a plurality of heat generators to multiple locations of an interior heat exchange surface of a heat exchange structure, the interior heat exchange surface being positioned in an air duct of the heat exchange structure, the heat generators being coupled to an exterior heat exchange surface of the heat exchange structure and disposed along an elongated direction of the air duct, and heating air in the air duct successively by transferring thermal energy from the multiple locations of the interior heat exchange surface to the air as the air flows through the air duct, enhancing air flow in the air duct by buoyancy of heated air.

Implementations of the apparatus may include one or more of the following features. Transferring thermal energy from the heat generators to the interior heat exchange surface includes transferring thermal energy through a wall separating the exterior heat exchange surface and the interior heat exchange surface, the wall having a thickness less than 5 mm. In some examples, the method includes enhancing air flow in the air duct by using a fan. In some examples, the thermal energy is transferred from the heat generators to the air flowing in the air duct without using a fan. Transferring heat from the heat generators to the multiple locations includes transferring heat from electronic devices to the multiple locations.

In another aspect, in general, a method includes transferring thermal energy from a heat generator to a heat pipe, transferring thermal energy from different portions of the heat pipe to a heat exchange structure that includes a plurality of elongated air ducts, the different portions of the heat pipe aligned along an elongated direction of the air ducts, and heating the air in the air ducts successively by transferring thermal energy from the different portions of the heat pipe to the air flowing in the air ducts, enhancing air flow in the air ducts by buoyancy of heated air.

Implementations of the apparatus may include one or more of the following features. In some examples, the method includes enhancing air flow in the air ducts by using a fan. In some examples, the thermal energy is transferred from the heat pipe to the air flowing in the air ducts without assistance of a fan.

In another aspect, in general, a method includes mounting an array of heat generators on an exterior heat exchange surface of a heat exchange structure, in which the heat exchange structure includes elongated air ducts, the array of heat generators includes groups of heat generators, each group having heat generators mounted along an elongated direction of the air ducts. The heat exchange structure includes interior heat exchange surfaces positioned in the elongated air ducts, in which the interior heat exchange surfaces are configured to successively heat air in the air ducts by transferring heat from the array of heat generators to the air flowing in the air ducts and enhancing air flow in the air ducts due to buoyancy of heated air.

Implementations of the apparatus may include one or more of the following features. Mounting the array of heat generators includes mounting an array of light sources.

In another aspect, in general, a method of operating a light source that has a plurality of light emitting devices includes providing electric power to the plurality of light emitting devices, and transferring thermal energy from the light emitting devices to multiple locations of an exterior heat exchange surface of a heat exchange structure, in which the heat exchange structure includes an elongated air duct and an interior heat exchange surface positioned in the air duct. The method includes transferring thermal energy from the multiple locations on the exterior heat exchange surface to multiple locations on the interior heat exchange surface through a wall separating the interior and exterior heat exchange surfaces, and successively heating air in the air duct by transferring thermal energy from the multiple locations on the second heat exchange surfaces to air flowing in the air ducts, enhancing air flow in the air duct by buoyancy of heated air.

Implementations of the apparatus may include one or more of the following features. In some examples, the method includes using a fan to enhance air flow in the air duct. In some examples, the light source is operated without assistance of a fan to enhance heat dissipation.

In another aspect, in general, an apparatus includes a heat exchange structure having an exterior surface and an interior surface, the interior surface defining an elongated air duct, and heat sources that are coupled to the exterior surface of heat exchange structure and distributed along the exterior surface. The heat sources transfer heat to portions of the interior surface along the elongated direction of the air duct such that air inside the air duct is heated by the portions of the interior surface successively as the air flows in the air duct.

Implementations of the apparatus may include one or more of the following features. The heat sources are distributed in a way such that the interior surface is substantially isothermal. Air flow in the air duct is enhanced by buoyancy of hot air that causes cool air to be pumped into a first opening of the air duct and hot air to be pushed out of a second opening of the air duct. In some examples, the heat sources include electronic devices. The electronic devices may include light emitting diodes. The apparatus includes signal lines that are attached to the heat exchange structure, the electronic devices being attached to the signal lines. In some examples, the heat sources include different portions of a heat pipe. The heat exchange structure includes an exterior surface and an interior surface, the heat sources being coupled to the exterior surface, the interior surface defining the air duct.

The heat exchange structure includes a metal structural section that defines a structure of the air duct. The heat exchange structure includes a structural section and a thin layer of material attached to the structural section, the thin layer of material having a thickness less than 100 microns. The thin layer of material includes a first sub-layer and a second sub-layer, the first sub-layer includes a solid layer that is impermeable to air molecules, the second sub-layer having a porous structure that is at least partially permeable to air molecules. A surface of the thin layer defines the air duct. The thin layer includes a ceramic material.

In another aspect, in general, an apparatus for dissipating heat from electronic components, the apparatus including a heat exchange structure defining an elongated air duct, and signal lines configured to be coupled to the electronic components. The signal lines are coupled to the heat exchange structure and define locations for attaching the electronic components, in which the locations are disposed along an elongated direction of the air duct.

Implementations of the apparatus may include one or more of the following features. The apparatus includes the electronic components. The electronic components include light emitting diodes. The locations are distributed in a way such that when the electronic components are attached to the signal lines and in operation, surfaces of the heat exchange structure facing the air duct are substantially isothermal. The heat exchange structure includes an exterior surface and an interior surface, the signal lines being coupled to the exterior surface, the interior surface defining the air duct. The heat exchange structure includes a metal structural section that defines the structure of the heat exchange structure. The heat exchange structure includes a composite substrate that includes a substrate and a thin layer of material attached to the substrate, the thin layer of material having a thickness less than 100 microns. A surface of the thin layer defines the air duct. The thin layer includes a ceramic material. Air flow in the air duct is enhanced by buoyancy of hot air that causes cool air to be pumped into a first opening of the air duct and hot air to be pushed out of a second opening of the air duct.

In another aspect, in general, a method includes transferring heat from heat sources to a heat exchange structure, the heat exchange structure defining an elongated air duct, the heat sources being disposed along a direction parallel to an elongated direction of the air duct, and heating air inside the air duct successively as the air flows in the air duct.

Implementations of the apparatus may include one or more of the following features. The method includes maintaining surfaces of the heat exchange structure facing the air duct at a substantially uniform temperature. The method includes enhancing air flow in the air duct by buoyancy of hot air that causes cool air to be pumped into a first opening of the air duct and hot air to be pushed out of a second opening of the air duct. Transferring heat from the heat sources to the heat exchange structure includes transferring heat from electronic devices to the heat exchange structure. Transferring heat from the electronic devices to the heat exchange structure includes transferring heat from light emitting diodes to the heat exchange structure. Transferring heat from the heat sources to the heat exchange structure includes transferring heat from different portions of a heat pipe to the heat exchange structure. Heating the air inside the air duct includes transferring heat from a metal structural section to the air in the air duct. The heat exchange structure includes a thin layer of material having a thickness less than 100 microns, a surface of the thin layer facing the air duct, and heating the air inside the air duct includes transferring heat from the thin layer to the air. The method includes enhancing air flow in the air duct by buoyancy of hot air that causes cool air to be pumped into a first opening of the air duct and hot air to be pushed out of a second opening of the air duct.

In another aspect, in general, a method includes mounting heat sources on a heat exchange structure along a direction parallel to an elongated direction of an elongated air duct defined by the heat exchange structure.

Implementations of the apparatus may include one or more of the following features. Mounting heat sources on a heat exchange structure includes mounting electronic components on the heat exchange structure. Mounting heat sources on a heat exchange structure includes mounting different portions of a heat pipe on the heat exchange structure. The heat exchange structure includes an exterior surface and an interior surface, the interior surface defining the air duct, and mounting the heat sources on the heat exchange structure includes mounting the heat sources on the exterior surface of the heat exchange structure.

In another aspect, in general, a method of operating a light source includes providing electric power to a light emitting device, transferring thermal energy from the light emitting device to a first heat exchange surface of a heat exchange structure, transferring the thermal energy from the first heat exchange surface to a second heat exchange surface of the heat exchange structure, the second surface defining an air duct, and transferring thermal energy from the second heat exchange surface to air flowing in the air duct.

Implementations of the apparatus may include one or more of the following features. The method includes distributing the thermal energy to cause the second heat exchange surface to become substantially isothermal. The method includes enhancing air flow in the air duct by buoyancy of hot air that causes cool air to be pumped into a first opening of the air duct and hot air to be pumped out of a second opening of the air duct.

Advantages of the heat exchange structure can include one or more of the following. By placing the heat generators, such as light emitting diodes, along an elongated direction of the air ducts, air in the air ducts can be heated successively to generate an air pumping effect to move air faster for more efficient heat exchange without the use of fans and without increasing the overall volume of the heat exchange structure. When the surface properties of the heat exchange structure are modified to increase the micro- and/or nano-structures of the heat dissipation surface, the efficiency of heat exchange between the heat exchange structure and ambient air can be increased without the use of fans and without increasing the overall volume of the heat exchange structure. The surface properties of the heat exchange structure can be modified to enhance the solid surface absorption and de-absorption potential for air molecules. The action of absorption and de-absorption can create micro turbulences on the surfaces of the heat exchange structure, which can enhance the heat exchange rate.

A number of patent applications have been incorporated by reference. In case of conflict with the references incorporated by reference, the present specification, including definitions, will control.

Other features and advantages of the invention are apparent from the following description, and from the claims.

DESCRIPTION OF DRAWINGS

FIG. 5B is a cross-sectional diagram of a metal structural section and a thin ceramic layer.

FIG. 5C is a diagram of structures at a surface of the thin ceramic layer of FIG. 5B.

FIG. 5D is a photograph of a cross-sectional diagram of a metal structural section and a thin ceramic layer.

DESCRIPTION

Heat Exchange Structure Having Air Ducts

Figure 1:
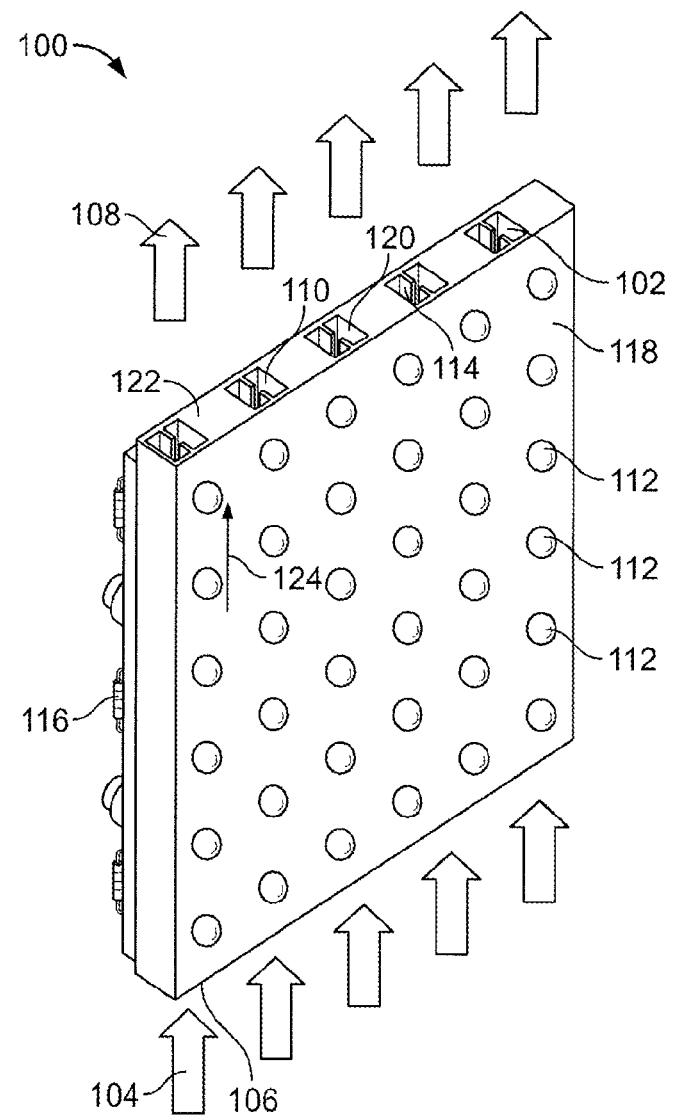
FIGS. 1-4 show heat exchange structures.

Referring to FIG. 1, a solid heat exchange structure 100 removes heat from heat sources 112 with a high efficiency. The heat exchange structure 100 is made of a material having a high heat conduction coefficient and functions as a heat conduit to transfer heat from the heat sources 112 to ambient air or other gases. The heat exchange structure 100 has exterior heat exchange surfaces 118 that can dissipate heat to the ambient air. The heat exchange structure 100 also has interior heat exchange surfaces 120 positioned in elongated air ducts 102.

In this description, an "interior surface" of a device refers to a surface interior to an overall structure of the device. A heat source can be a heat generator, for example, active electronic devices such as light emitting diodes (LEDs) that generate heat. A heat source can also be a portion of a heat pipe that transfers heat from a heat generator to a heat dissipation surface.

The interior heat exchange surfaces 120 can dissipate heat to the air flowing in the air ducts 102. Due to an air pumping effect described below, airflow in the air duct across the interior heat exchange surfaces 120 is greater than airflow across the exterior heat exchange surfaces 118. The air ducts 102 enhance heat dissipation without increasing the overall volume of the structure 100.

The air ducts 102 each have two openings. In this example, where the air ducts are aligned substantially vertically, the first openings of an air duct is a lower openings 106, and the second opening is an upper opening 110. Cold air 104 enters the air ducts 102 from the lower openings 106, and hot air 108 exits the air ducts 102 from the upper openings 110.

In some examples, the heat sources 112 are distributed on the exterior surface 118 along a direction 124 parallel to an elongated direction (lengthwise direction) of the air ducts 102 so as to maintain the interior heat exchange surfaces 120 in a substantially isothermal state, i.e., common temperature. The temperature difference between different portions of the heat exchange surfaces 120 is smaller than the temperature difference between the heat exchange surfaces 120 and the ambient air. As the air rises inside the air ducts 102 due to hot air buoyancy, the air is successively heated by the interior heat exchange surfaces 120, creating an air pumping effect to cause the air to continue to rise.

In examples in which the heat sources 112 are concentrated near the lower portion of the exterior heat exchange surface 118, the lower portion of the interior heat exchange surfaces 120 has a higher temperature, and the upper portion of the interior heat exchange surfaces 120 has a lower temperature. The air heated by the lower portion of the interior heat exchange surfaces 120 may become cooler as the air rises within the air ducts 102, causing the air to flow more slowly due to reduced air buoyancy.

The area of the heat exchange surfaces 120 in the air ducts 102 can be increased by using fins 114 that protrude into the air ducts 102. The fins 114 extend in a direction 124 parallel to the elongated direction of the air ducts 102 so that the fins 114 do not block the air flow.

In some examples, the heat exchange structure 100, including the fins and the walls that define the air ducts 102, are formed, for example by extrusion, from a single piece of metal (for example, aluminum) having a high thermal conductivity. By using a single piece of metal, there is no thermal interface within the solid heat exchange structure 100, thus improving transfer of heat from a surface of the heat exchange structure 110 that receives heat from the heat sources 112 to another surface of the heat exchange structure 110 that dissipates heat to the air.

Electronic circuitry 116 can be mounted on the heat exchange structure 100, in which the circuitry 116 interacts with the heat sources 112. Examples of the heat sources 112 include light emitting diodes (LEDs) and microprocessors.

Portions 122 of the heat exchange structure 100 between the air ducts 102 can be solid. The portions 122 alternatively can be hollow and include fluid (for example, distilled water), so that the portions 122 function as heat pipes. In examples where the heat sources 112 are not distributed along the direction 124, such as when there is only one heat source, or where the heat sources are spaced apart along a direction at an angle to the direction 124, the heat pipes can be used to distribute the heat along the direction 124 and heat the air in the air ducts 102 successively as the air passes through the air ducts 102.

Figure 2:
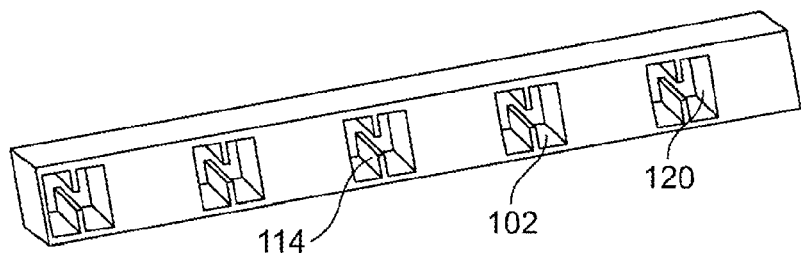

FIG. 2 shows another view of a portion of the heat exchange structure 100, including the interior heat exchange surface 120, which defines the walls of the air ducts 102, and fins 114 that protrude into the air ducts 102.

Figure 3:
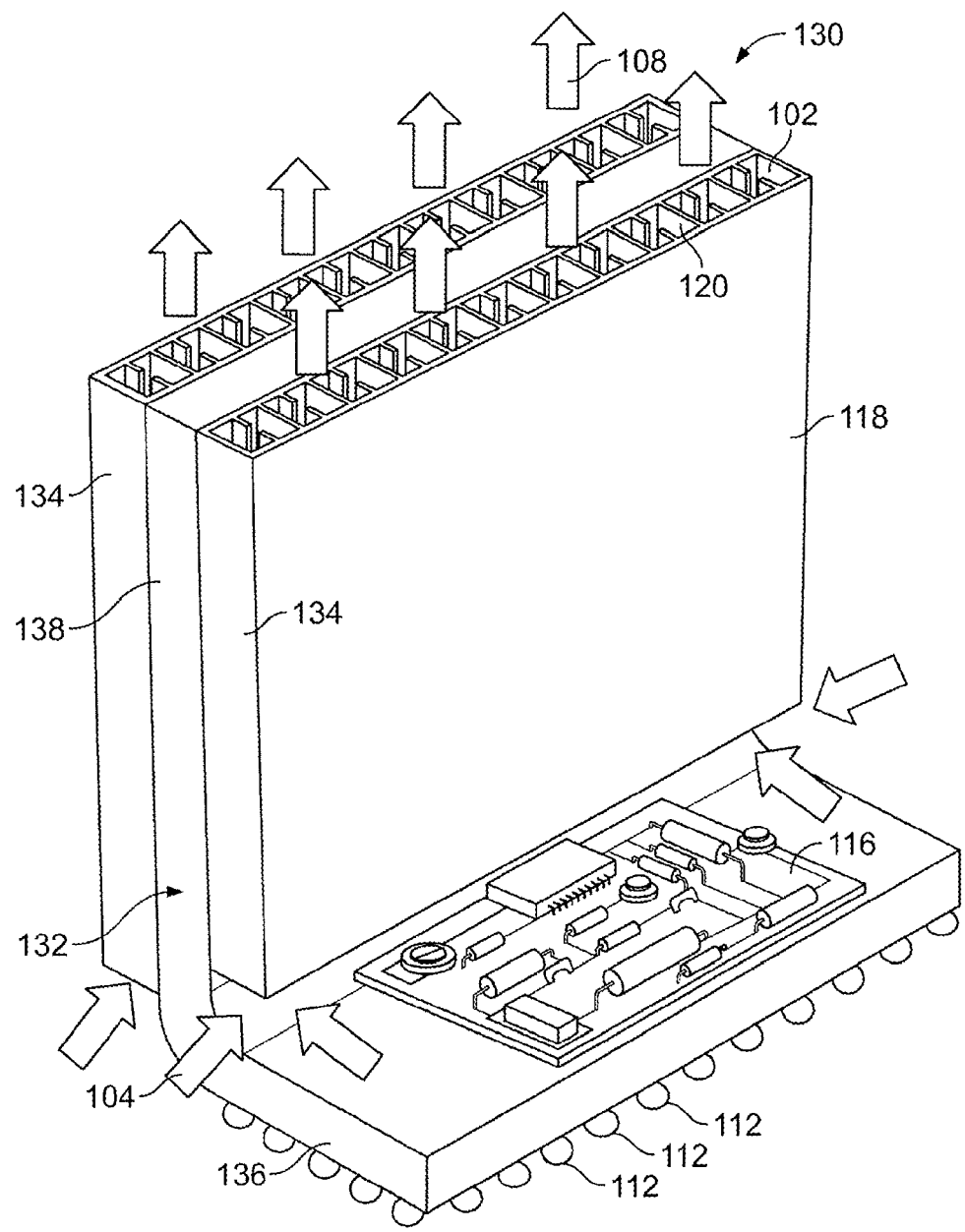

FIG. 3 shows an example of a heat exchange structure 130 that uses a heat pipe 132 to transfer heat from heat sources 112 to heat exchange units 134. The heat pipe 132 has a lower portion 136 that contacts the heat sources 112 and an upper portion 138 that contacts the heat exchange units 134. The upper portion 138 of the heat pipe 132 can be located between two heat exchange units 134. The heat exchange units 134 define air ducts 102 to enhance the flow of air over heat exchange surfaces, similar to the air ducts 102 of the structure 100 in FIG. 1.

The heat pipe 132 includes a fluid (for example, distilled water), and uses evaporative cooling to transfer thermal energy from the lower portion 136 to the upper portion 138 by the evaporation and condensation of the fluid. The upper portion 138 functions as a distributed heat source to the heat exchange units 134 to maintain the walls of the air ducts 102 at substantially the same temperature. The walls of the air ducts 102 heats the air inside the air ducts 102 successively, creating an air pumping effect to cause heated air to rise faster in the air ducts 102.

In some examples, the heat pipe 132 and the heat exchange units 134 are fabricated by, for example, an extrusion process in which the heat pipe 132 and the heat exchange units 134 are formed together from one piece of metal (for example, aluminum) having a high thermal conductivity. In some examples, the heat pipe 132 can be formed by, for example, welding (sealing) the ends of some of the heat exchange units 134. By using a single piece of metal, there is no thermal barrier within the solid heat exchange structure 130, so that heat conduction within the heat exchange structure 130 is better, and the transfer of heat from the heat sources 112 to the solid-air heat exchange surfaces is more efficient, as compared to a structure in which the heat pipe 132 and the heat exchange units 134 are separate pieces that are attached together.

An advantage of the heat exchange structure 130 is that the upper portion of the heat pipe is aligned substantially parallel to the elongated direction of the air ducts 102. Heated air rises within the air ducts, such that cold air enters the air ducts from below and hot air exits the air ducts from above. Heated vapor rises inside the heat pipe, and condensed liquid flows downward. This allows the transfer of thermal energy from the heat sources 112 to the air inside the air ducts 102 to be more efficient, as compared to examples where heat pipes transfer heat to heat dissipating fins, in which the heat pipes are aligned along a direction perpendicular to the direction of air flow between adjacent heat dissipating fins.

Figure 4:
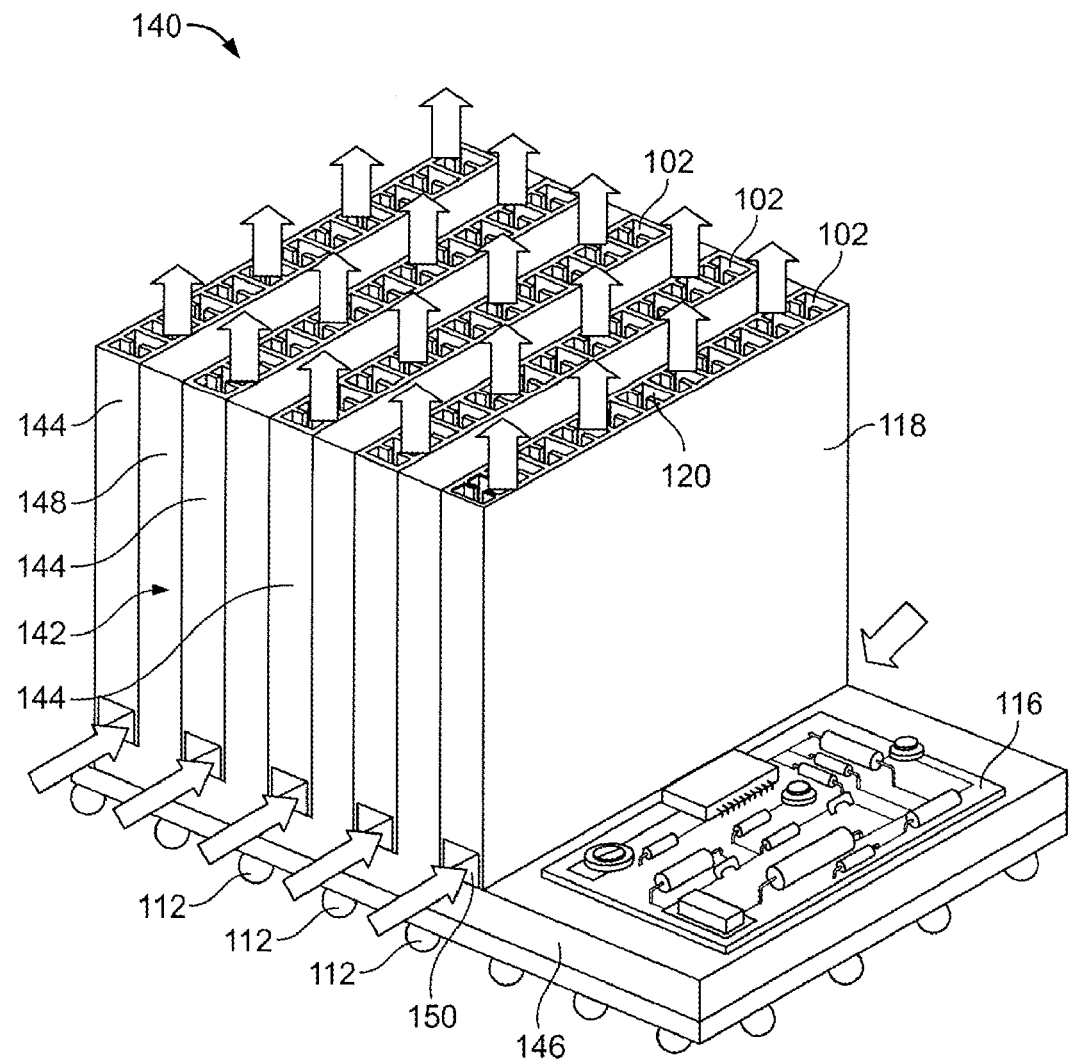

FIG. 4 shows an example of a heat exchange structure 140 that uses a heat pipe 142 to transfer heat from heat sources 112 to heat exchange units 144. The heat pipe 142 has a lower portion 146 that contacts heat sources 112 and upper portions 148 that are sandwiched between heat exchange units 144. The heat exchange units 144 define air ducts 102 to enhance the flow of air over the heat exchange surfaces, similar to the air ducts 102 of the structure 100 in FIG. 1. Openings 150 are provided at the sides near the bottom of the heat exchange units 144 to allow cool air to flow into the air ducts 102. The heat exchange structure 140 has more heat exchange units 144 and can dissipate heat at a faster rate (as compared to the heat exchange structure 100 or 130).

Commercially available thermal simulation software, such as FLOTHERM, from Flomerics Group PLC, Hampton Court, United Kingdom, can be used to optimize the size of the heat pipe 138, the size and number of the heat exchange units 134, and locations of the inlet and outlet openings of the air ducts 102. These parameters depend in part on the geometry of the air ducts 102, the material of the heat exchange structure 140, and the normal operating temperature of the heat sources 112.

In some examples, the heat pipe 142 and the heat exchanging units 144 are fabricated by an extrusion process in which the heat pipe 132 and the heat exchange units 134 are formed from one piece of metal (for example, aluminum) having a high thermal conductivity. By using a single piece of metal, there is no thermal barrier within the solid heat exchange structure 140, so that heat conduction within the heat exchange structure 140 is better, and the transfer of heat from the heat sources 112 to the solid-air heat exchange surfaces is more efficient.

As an alternative to using heat pumping by natural buoyancy of heated air, compressed air can be injected into the lower openings of the air ducts 102 of the heat exchange structures 100, 130, or 140. The compressed air absorbs heat as it expands and decompresses to room pressure, further enhancing removal of heat from the solid-air heat exchange surface 120 of the solid heat exchange structure 100, 130, or 140. A compressor for compressing air can be located at a distance from the heat exchange structure 100, 130, or 140, and a pipe can convey the compressed air to the lower openings of the air ducts 102. The compressed air can also be provided by a compressed air container.

The heat exchange structures described above, such as 100 (FIG. 1), 130 (FIG. 3), and 140 (FIG. 4), can be used with or without a fan. Note that a higher fan speed does not necessarily result in better heat transfer. For a given configuration of the heat exchange structure 100, 130, or 140, when used with a fan, the speed of the fan can be adjusted to obtain an optimal heat exchange rate.

For the heat exchange structures 100, 130, and 140, when the air duct 102 is long and the rate of heat exchange between the air duct walls and the air inside the air duct is large, the pressure inside the air duct (especially near the upper opening 110) is lower than the ambient atmospheric pressure. The flow of hot air out of the upper opening 110 may be impeded by the higher ambient atmospheric pressure, reducing the efficiency of heat exchange between the air and the air duct walls.

In some examples, the heat exchange structure 100 includes holes on the side walls of the air ducts 102 to allow cold air to enter mid-sections of the air ducts and intermix with the hot air. This reduces the temperature of the hot air in the air ducts 102, reducing the pressure difference between the hot air exiting the upper opening 110 and the ambient air outside of the upper opening 110, and may result in better heat dissipation.

In some examples, the heat exchange structure (e.g., 100) can be oriented such that the air ducts 102 are positioned horizontally so that the openings 106 and 110 are of the same height. In such cases, the holes can facilitate air flow in the air ducts. A horizontally positioned air duct can have a heat exchange efficiency about, for example, 50% to 90% of the heat exchange efficiency of the same air duct positioned vertically, depending on the duct size and the conductivity of the heat exchange structure.

In the examples of FIGS. 1 and 3, holes can be drilled on the heat exchange surface 118 of the heat exchange structures 100 and 130, respectively. In the example of FIG. 4, the heat exchange unit 144 can be made longer than the heat pipes 148, so that holes can be drilled in the outer walls of the heat exchange unit 144 that extend beyond the heat pipes 148.

The size, number, and location of the holes depend in part on the geometry of the air ducts, the material of the heat exchange structure, and the normal operating temperature of the heat sources 112. Commercially available thermal simulation software, such as FLOTHERM, can be used to determine the size, number, and location of the holes.

Modification of Surface Properties

The solid-air heat exchange surfaces of the heat exchange structure 100, 130, or 140 include the surfaces 120 and the surfaces of the fins 114 facing the air ducts 102, and the exterior surfaces 118. In some examples, the solid-air heat exchange surfaces can be coated with a thin layer of material, such as a ceramic material, to modify the surface properties of the solid heat exchange structure to enhance heat exchange with the air molecules. For example, the thickness of the coated ceramic material can be less than 100 μm.

The modification of the surface property is also applicable in other structures where good, solid-air thermal conductivity is desirable.

The thin layer of material can include either or both of (a) a spiky micro- and/or nano-structure, and (b) a porous micro- and/or nano-structure. By applying the thin layer of material, the surface energy of the solid structure can be modified to (1) enhance the micro surface area while keeping the macroscopic surface dimension, and (2) modify the solid surface potential of trapping and de-trapping (absorption and de-absorption) of air molecules for better heat transfer. The thin layer of material coated on the heat exchange structure not only increases the effective surface heat exchange area, but also changes the way that air molecules interact with the surface of the heat exchange structure, thereby enhancing the ability of the heat exchange structure to exchange heat with the ambient air.

Figure 5A:
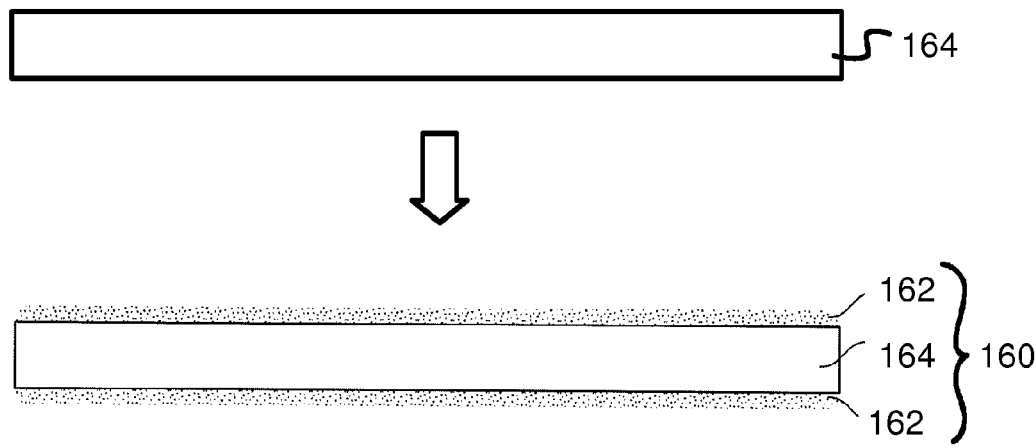
FIG. 5A shows a metal structural section and a heat exchange structure.

Referring to FIG. 5A, a heat exchange structure 160 is constructed by attaching thin ceramic layers 162 to a metal structural section 164. The metal structural section 164 is rigid and defines the structure of the heat exchange structure 160. The thin ceramic layers 162 modify the surface properties of the metal structural section 164.

The thin ceramic layers 162 can be coated onto the metal structural section 164 by a micro-arc-oxidation plating process, in which certain chemicals used to form the thin ceramic layers 162 are mixed into an electrolyte used in the plating process. The ingredients of the chemicals include one or more of aluminum oxide, aluminum nitride, aluminum carbide, beryllium oxide, beryllium nitride, beryllium carbide, boron oxide, hafnium oxide, lithium oxide, lithium nitride, lithium carbide, magnesium oxide, magnesium nitride, magnesium carbide, silicon oxide, silicon nitride, silicon carbide, titanium oxide, titanium nitride, titanium carbide, zirconium oxide, zirconium carbide, zirconium nitride, zinc oxide, zinc carbide, and zinc nitride. The ingredients may also include carbon.

The metal structural section 164 can be made of a single metal, such as aluminum, beryllium, lithium, magnesium, titanium, zirconium, or zinc. The metal structural section 164 can also be made of an alloy, such as an alloy of at least two of aluminum, magnesium, titanium, zirconium, and zinc.

The thin layer of ceramic material can be made of, for example, aluminum oxide, aluminum nitride, aluminum carbide, beryllium carbide, beryllium oxide, beryllium nitride, boron oxide, carbon, hafnium carbide, hafnium oxide, lithium carbide, lithium nitride, lithium oxide, magnesium carbide, magnesium oxide, magnesium nitride, silicon carbide, silicon oxide, silicon nitride, titanium carbide, titanium oxide, titanium nitride, zirconium oxide, zirconium carbide, zirconium nitride, zinc carbide, zinc oxide, or zinc nitride. The thin layer of ceramic material can also be made of a combination of two, three, or more of, for example, aluminum carbide, aluminum oxide, aluminum nitride, beryllium carbide, beryllium oxide, beryllium nitride, boron oxide, carbon, hafnium carbide, hafnium oxide, lithium carbide, lithium nitride, lithium oxide, magnesium carbide, magnesium oxide, magnesium nitride, silicon carbide, silicon oxide, silicon nitride, titanium carbide, titanium oxide, titanium nitride, zinc carbide, zinc oxide, zinc nitride, zirconium oxide, zirconium carbide, and zirconium nitride.

Referring to FIG. 5B, in some examples, the plating process causes a thin ceramic layer 162 having porous and spiky structures to form on the metal structural section 164. In some examples, the thin ceramic layer 162 includes a first sub-layer 166 and a second sub-layer 168. The first sub-layer 166 is a solid ceramic thin layer that is impermeable to air molecules, and can have a thickness less than 10 microns. In some cases, the first sub-layer 166 is less than 5 microns. The second sub-layer 168 is a sponge-like porous layer that is partially permeable to air molecules, and has a thickness less than 100 microns. In some examples, the second sub-layer 168 is less than 25 microns. The second sub-layer 168 has porous structures with voids having diameters of a few microns. The shape of the voids can be irregular. The walls of the porous structures can range from submicron to microns.

Each of the sub-layers 166 and 168 can be made of a ceramic material or a ceramic composite. For example, the sub-layers 166 and 168 can be made of ceramic composites that include carbon, silicon oxide, aluminum oxide, boron oxide, titanium nitride, and hafnium nitride.

FIG. 5C shows an enlargement of a surface 169 of the second sub-layer 162. The surface 169 has spiky structures 167 that have heights less than 250 nanometers and diameters less than 1 micron (ranging from a few nanometers to several hundred nanometers).

FIG. 5D is a cross sectional photograph of the metal layer 164 and the ceramic thin layer 162. In this example, the thickness of the thin layer 162 is about 78 microns. The first sub-layer 166 can be seen at the interface between the lower, darker portion and the upper, brighter portion of the photograph. The spiky structures 167 are too small to be seen in the photograph.

The heat exchange structure 160 is a good electric insulator (due to the thin layer of ceramic at the surface), as well as a good thermal conductor. Because of the good electric insulation property, the heat exchange structure 160 can be used as a printed circuit board. For example, a resin coated copper foil can be adhered to the surface of the heat exchange structure 160 and etched to form signal lines and bonding pads. Electronic circuits and semiconductor devices can be soldered to the bonding pads. Portions of the heat exchange structure 160 that are not covered by the copper signal lines are exposed to ambient air and provide better heat dissipation (as compared to a circuit board made of a dielectric material).

The thin ceramic layer 162 can increase the effective surface heat exchange area and change the way that air molecules interact with the surface of the solid structure. The ceramic layer can have spiky micro- and/or nano-structures, and/or porous micro- and/or nano-structures. The porous structures allow air to permeate the thin layer. The spiky and/or porous structures can enhance the micro surface area, and modify the solid surface potential of trapping and de-trapping (absorption and de-absorption) of air molecules for better heat transfer between the heat exchange solid surface and ambient air.

Instead of coating the metal structural section 164 with a thin layer of ceramic material, the metal structural section 164 can also be coated with a ceramic composite material, which includes two or more ceramic materials, also using the micro-arc-oxidation plating process, using a modified electrolyte having suspended nano-ceramic materials in the electrolyte.

Without being bound by its accuracy, below is a theory of why modifying the surface potential of the solid-air heat exchange surface may enhance heat transfer from the solid surface to air molecules.

Thermal energy in a solid is manifested as vibration of molecules in the solid, and thermal energy in a gas is manifested as kinetic energy of the gas molecules. When gas molecules come into contact with the molecules at the surface of the solid, energy may be transferred from the solid molecules to the gas molecules, so that the solid molecules have reduced vibrations, and the gas molecules have increased kinetic energy. The transfer of thermal energy from molecules of the solid to the gas molecules can be enhanced by increasing the interaction between solid and gas molecules.

Figure 6:
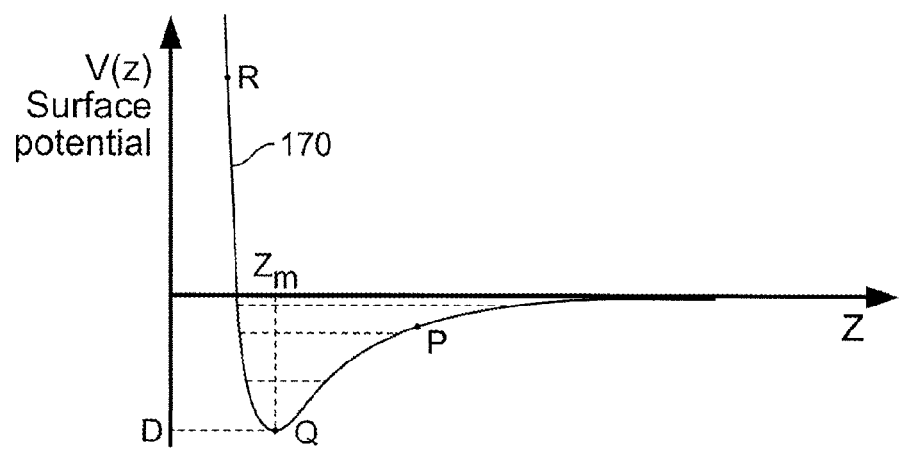
FIGS. 6-7 are graphs.

FIG. 6 shows a curve 170 that represents a relationship between the surface potential of a solid and the distance from the surface of the solid. At distances far away from the surface of the solid (for example, more than one micron), the surface potential is near zero. At locations (such as at a point P) closer to the solid surface, the surface potential is negative. When the distance to the solid surface is a particular value Zm (such as at a point Q), the surface potential has a minimum value D. At locations closer than Zm (such as at a point R), the surface potential increases and becomes positive. For metals, such as aluminum alloys, the value of Zm can be in the range of 10 nm to 100 nm.

The curve 170 indicates that, at the vicinity (e.g., within 100 nm) of a solid surface, there is a "potential well" that can "trap" air molecules having lower kinetic energy. For air molecules that are in the vicinity of the solid surface and have kinetic energy that are less than D, the air molecules may be trapped near the surface of the solid because their kinetic energy are not sufficient to overcome the negative surface potential of the solid. The trapped air molecules are more densely packed in the potential well, as compared to the air molecules at farther distances (e.g., more than 1 micron). The more densely packed air molecules move within the potential well and have higher probabilities of colliding with the molecules of the solid, causing energy to transfer from the solid molecules to the air molecules. If the air molecules have kinetic energy increased to a level sufficient to overcome the negative surface potential, the air molecules may be "de-trapped" and escape the potential well, carrying away thermal energy from the solid.

Figure 7:
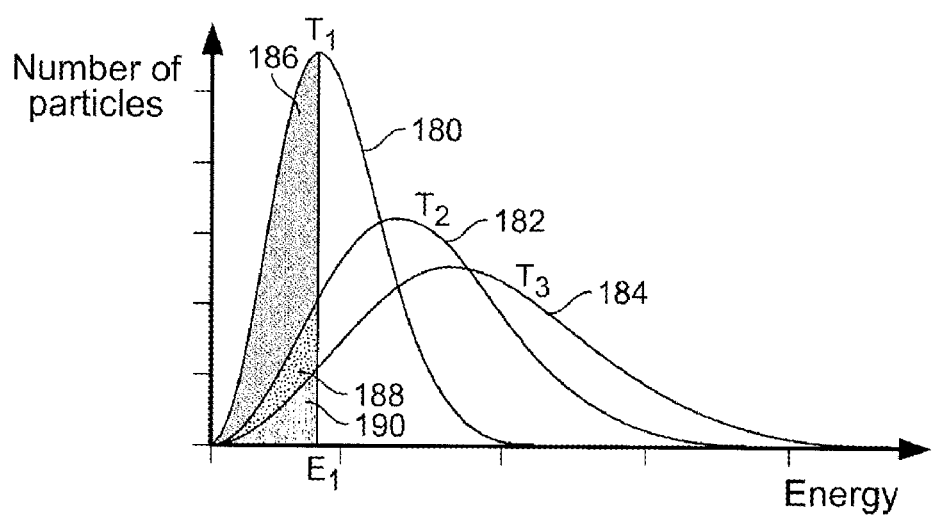

FIG. 7 shows the Maxwell-Boltzmann energy distribution of a given number of particles at different temperatures. Curves 180, 182, and 184 represent the energy distributions of particles at temperatures T1, T2, and T3, respectively, in which T1<T2<T3. The sum of shaded portions 186, 188, and 190 below the curve 180 represent the portion of particles having energy equal to or less than E1 at temperature T1. Similarly, the sum of shaded portions 188 and 190 below the curve 182 represent the portion of particles having energy equal to or less than E1 at temperature T2, and the shaded portion 190 below the curve 184 represent the portion of particles having energy equal to or less than E1 at temperature T3. The shaded portions 186, 188, and 190 indicate that, as the temperature increases, the percentages of particles having energy equal to or less than E1 decreases.

The kinetic energy of a particle increases in proportion to the square of the particle's speed. FIG. 7 indicates that, as the temperature increases, the percentages of particles having kinetic energy less than a certain value decreases. Consider a situation where air molecules having a temperature of T1 come into contact with a hot solid surface and are heated by the hot solid surface. Initially, a larger percentage of the cooler air molecules have lower kinetic energy that can be trapped in the potential well. After energy is transferred from the solid to the air molecules (for example, by phonon vibration), the temperature of the air molecules increases to T3. A portion of the air molecules (represented by the shaded portions 186 and 188) in the potential well gain sufficient energy to leave the potential well, carrying away energy from the solid. By continuously providing cooler air molecules to replenish the heated air molecules that escaped from the potential well, thermal energy can be continuously transferred from the solid surface to the air molecules.

Interaction between the solid and air molecules can be enhanced by modifying the surface potential of the solid, for example, by causing the potential well to become "deeper" (i.e., that the lowest potential level D becomes more negative), or altering the shape of the potential curve, so that more air molecules can be trapped in the potential well. The surface potential can be modified to increase the "trapping rate" of low energy air molecules to increase the density of solid-air molecule contacts, and to increase the "escaping rate" for high energy air molecules that carry energy away from the solid.

Referring back to FIG. 5A, coating the thin ceramic layer 162 on the metal structural section 164 has the effect of lowering the surface potential of the metal structural section 164, causing the potential well to become deeper. In addition, the ceramic layer 162 has spiky and/or porous features that increase the area that air molecules can interact with the molecules at the solid surface, further enhancing heat exchange between solid and air molecules. In some examples, the thin ceramic layer 162 can have a thickness of 10 gm. The solid-air heat exchange coefficient of the heat exchange structure 160 can be as much as five times greater than the solid-air heat exchange coefficient of the metal structural section 164 alone.

Experiments were conducted using a light source including twelve one-watt LEDs that were mounted on a planar heat exchange structure 160 having an area of 3×3 inch². The heat exchange structure 160 was formed using an aluminum substrate 164 and thin ceramic layers 162 made of carbon, silicon oxide, alumina, boron oxide, titanium nitride, and hafnium oxide. The layer 162 includes spiky micro- and nano-structures and porous micro- and nano-structures. When all of the twelve 1-watt LEDs were turned on, in an open air environment having a temperature between about 23 to 28 degree C., without using a fan, the hottest spot on the heat exchange structure 160 had a temperature not greater than 62 degrees C. The LEDs were powered on for 6 weeks without significant degradation in light output.

In some examples, the LEDs can be glued to the heat exchange structure 160. The LEDs can also be soldered onto bonding pads or signal lines made from a copper sheet that is glued to the heat exchange structure 160.

Experiments were conducted using a light source including a twenty-watt light module having LEDs, each LED rated about 0.75 watts and mounted on a heat exchange structure having air ducts, such as shown in FIG. 1. The heat exchange structure has dimensions of about 2-inch by 3-inch by 8.2 mm. The walls of the air ducts were 1.6 mm thick, and the cross section of the air duct has a square shape with dimension of about 5 mm-by-5 mm. Each air duct has four fins, each fin having a width of about 2 mm and protruding from one of four walls of the air duct. The heat exchange structure was formed using an extruded aluminum alloy (Al 6061), which was coated with a thin ceramic layer (having a thickness of about 20 microns) made of carbon, silicon oxide, alumina, boron oxide, titanium nitride, and hafnium oxide (e.g., see 162 of FIG. 5A). The thin ceramic layer includes spiky micro- and nano-structures and porous micro- and nano-structures.

When the light module was turned on with a power less than 15 watts, in an open air environment without using a fan, the hottest spot on the heat exchange structure had a temperature not greater than 60 degrees C. The LEDs were powered on for 10 weeks without significant degradation in light output. When the light module was turned on with a power of 20 watts, in an open air environment having a temperature between about 23 to 28 degree C., without using a fan, the hottest spot on the heat exchange structure had a temperature not greater than 75 degrees C. The LEDs were powered on for 8 weeks without significant degradation in light output.

Efficient heat dissipation is important for LEDs because the output power of the LEDs often degrade as temperature increases. When the temperature reaches a critical temperature, in some examples above 130 degrees C., the LEDs output may drop to near zero. The heat exchange structure 160 allows heat to be effectively dissipated away from the LEDs, so that the LEDs have higher outputs (i.e., brighter) and longer lifetimes.

The heat exchange structure 160 of FIG. 5A not only has a better solid-air heat exchange efficiency, it also has a better solid-liquid heat exchange efficiency. The transfer of heat from the solid to a liquid, and the transfer of heat from the liquid to the solid, can be enhanced by the thin ceramic coating 162.

The heat exchange structure 160 can dissipate heat into the ambient air faster than by using the metal structural section 164 alone. If the ambient air has a temperature higher than the solid, heat transfer from the ambient air to the heat exchange structure 160 will also be faster. In other words, the heat exchange structure 160 will absorb heat from ambient air faster than the metal structural section 164 alone.

Applications of Heat Exchange Structures

The following are examples of lighting devices that include high power LEDs and heat exchange structures that use air ducts and thin ceramic coatings on the structural sections.

Figure 10A:
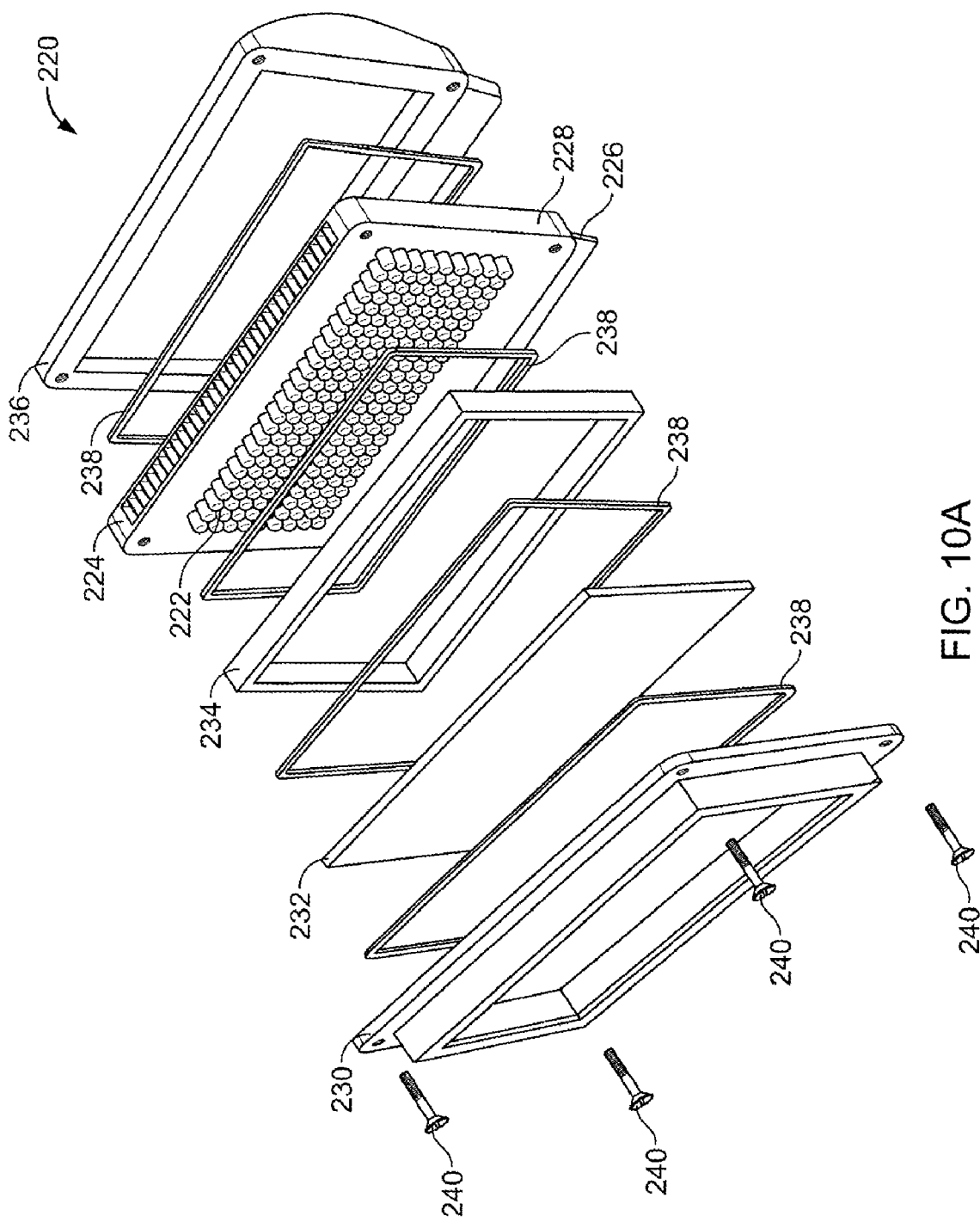
FIG. 10A is an exploded diagram of an automobile fog lamp.

FIG. 10A is an exploded diagram of an automobile fog lamp 220 that can be mounted on a vehicle. The fog lamp 220 includes an array of high power LEDs 222 coupled to a heat exchange structure 228. In some examples, the heat exchange structure 228 has a thin coating of ceramic material, similar to that shown in FIG. 5A. As discussed earlier, the thin coating of ceramic material improves the heat exchange efficiency of the heat exchange structure 228. The heat exchange structure 228 has air ducts 224 to create an air pumping effect to move air faster for more efficient heat exchange.

The heat exchange structure 228 can be made by a two-step process. First, a metal or metal alloy is used to form a structure having exterior wall(s) for mounting the LEDs 222 and interior walls for defining the air ducts. Second a thin layer of ceramic material is formed on the surface of the structure using a plating process.

In some examples, the fog lamp 220 is mounted on a vehicle such that the air ducts 224 are oriented substantially vertically. The use of thin coating of ceramic material and air ducts allow heat to be dissipated efficiently when the vehicle is not moving. When the vehicle is moving, an airflow scoop 226 directs air towards lower openings of the air ducts 224, increasing the airflow and further enhancing heat dissipation.

The fog lamp 220 includes a front window 230, a glass lens 232 to focus the light from the array of LEDs 222, a support 234 for supporting the glass lens 232, and a base cover 236. The glass lens 232 can be, for example, a Fresnel lens. O-rings 238 are provided to prevent moisture and dust from entering the fog lamp 220. Screws 240 are used to fasten the components of the fog lamp 220 together.

Figure 10B:
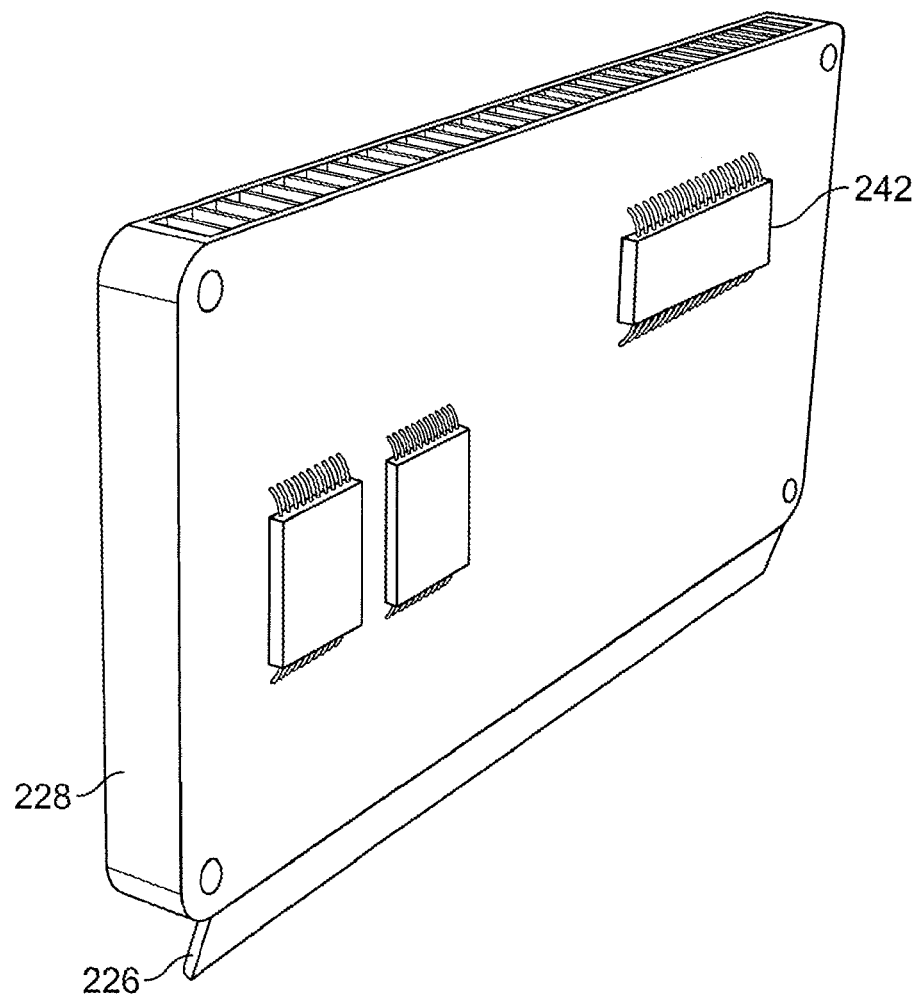
FIG. 10B shows electronic circuit devices attached to a heat exchange structure of the fog lamp of FIG. 10A.

FIG. 10B shows electronic circuit devices 242 that are mounted to an outer surface of the heat exchange structure 228. The devices 242 control the operation of the LEDs, for example, regulating the brightness of the LEDs.

Figure 10C:
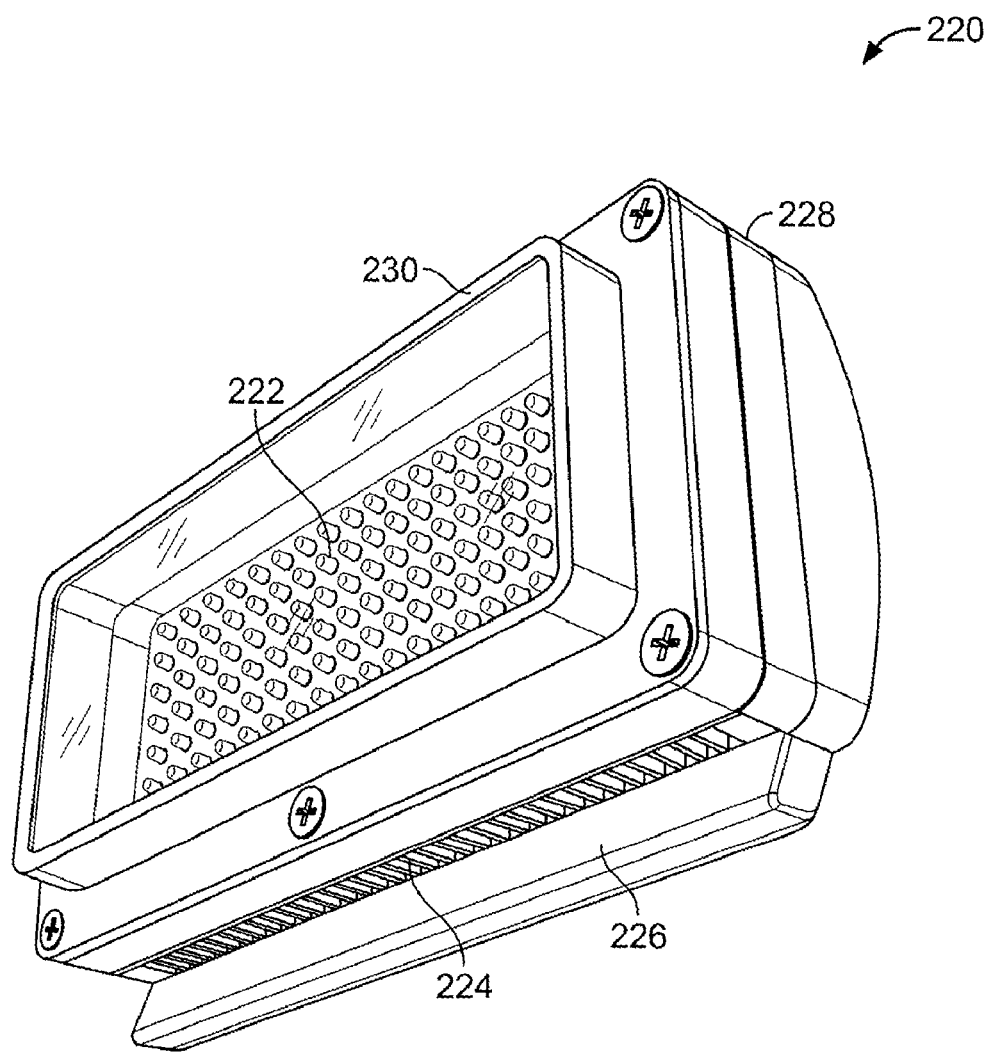
FIG. 10C is an assembled view of the lamp of FIG. 10A.

FIG. 10C is an assembled view of the automobile fog lamp 220. The fog lamp design can be applied to the head lamps and daylight running lamps for automobiles, provided that the size and wattage of the LEDs are adjusted accordingly.

Figure 11A:
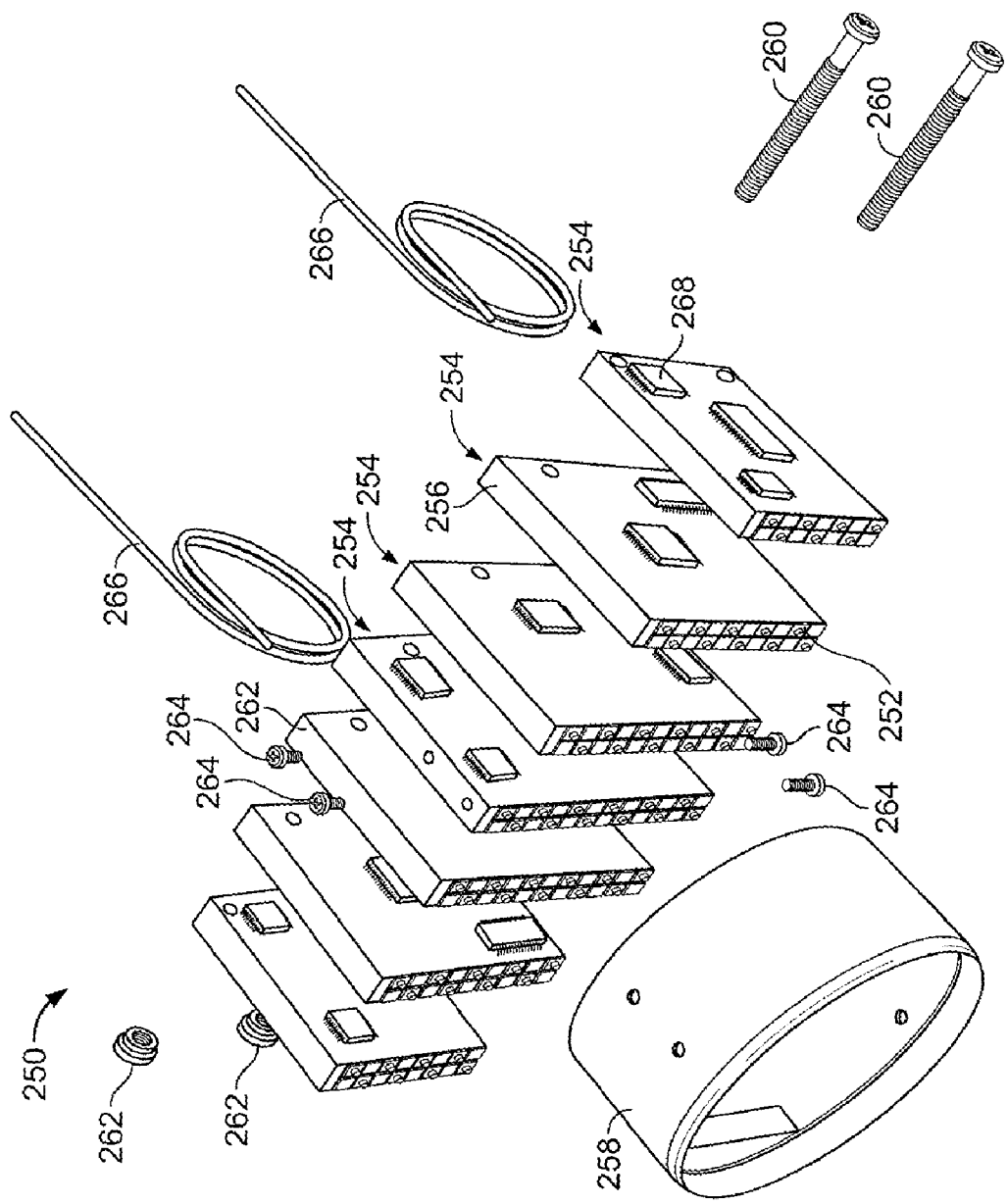
FIG. 11A is an exploded diagram of a front-emitting light source.

FIG. 11A is an exploded diagram of a front-emitting light source 250. The light source 250 can be designed to conform to standard sizes, such as MR-16 size. The light source 250 includes a light housing 258 and several LED modules 254 that have dimensions configured to fit in the light housing 258. Each LED module 254 includes LEDs 252 that are coupled to a heat exchange structure 256. In some examples, the surface of the heat exchange structure 256 has a thin layer of ceramic material to improve heat exchange efficiency. The heat exchange structure 256 has air ducts to enhance air flow. The LEDs 252 are positioned near the openings at one end of the air ducts.

The modules 254 are fastened together using screws 260 and nuts 262. The modules 254 are fastened to the light housing 258 using screws 264. Electrical circuits 268 are mounted on the side walls of the heat exchange structures 256 for controlling the LEDs. Electric power is provided to the LEDs 252 and the electrical circuits 268 through wires 266.

Figure 11B:
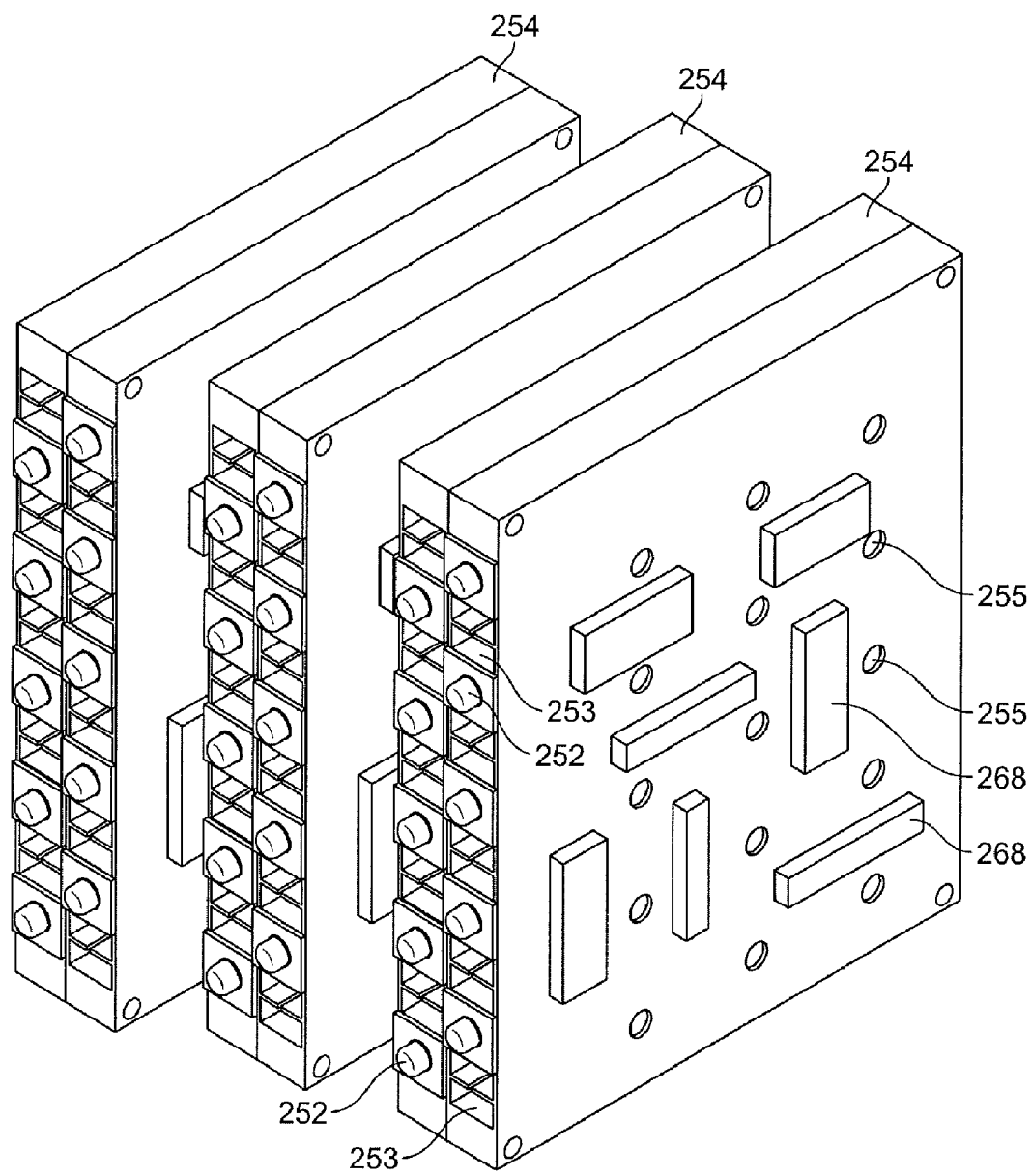
FIG. 11B shows LED modules of FIG. 11A.

FIG. 11B shows an example of the LED modules 254 in which heat generated by LEDs 252 are carried away by adjacent air ducts 253. In some examples, holes 255 may be formed on the side walls of the air ducts 253 to allow cold air to flow into the air ducts 253 and/or to allow hot air to flow out of the air ducts 253. The electronic components for electrical circuits 268 are positioned between the heat exchange structures 256 and act as spacers to facilitate air flow.

Figure 11C:
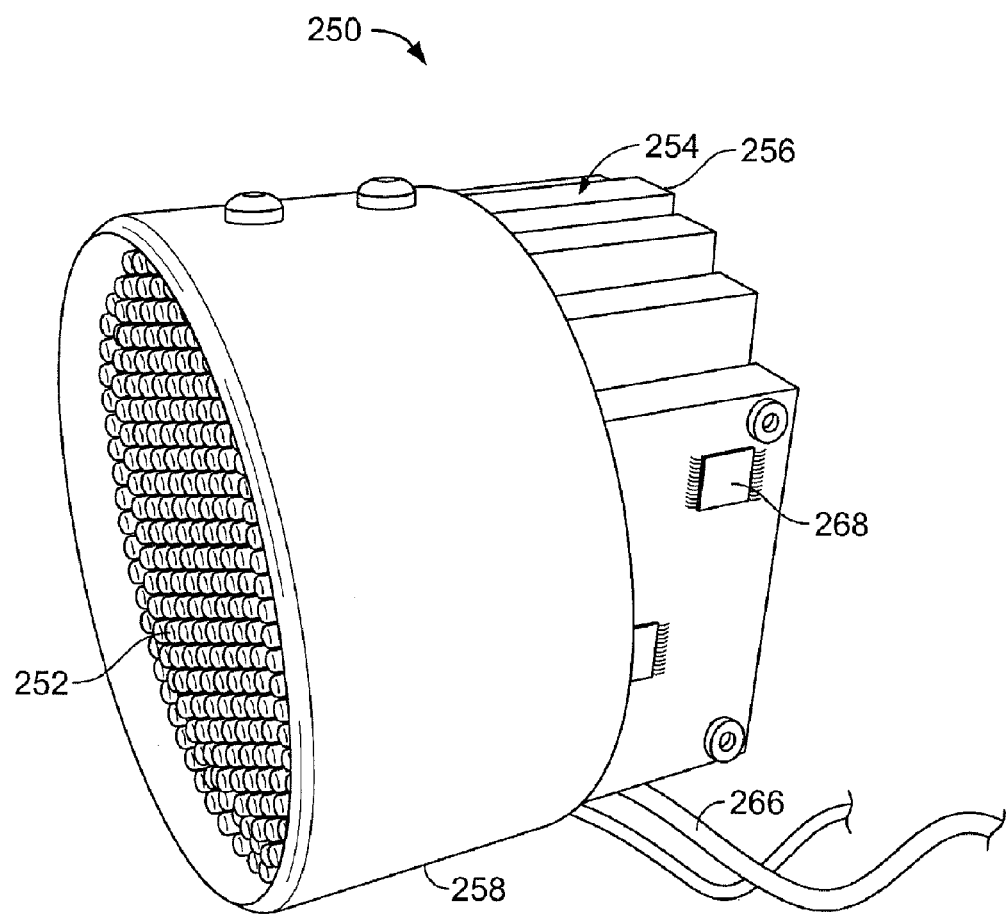
FIG. 11C is an assembled view of the light source of FIG. 11A.

FIG. 11C is an assembled view of the light source 250. In some examples, the light source 250 is oriented so that the LEDs 252 face a downward direction. Cool air enters the air duct openings near the LEDs 252 and exchanges heat with the air duct walls. Hot air exits through openings at the other end of the air ducts. The light source design can be modified to have different sizes and shapes.

Figure 12A:
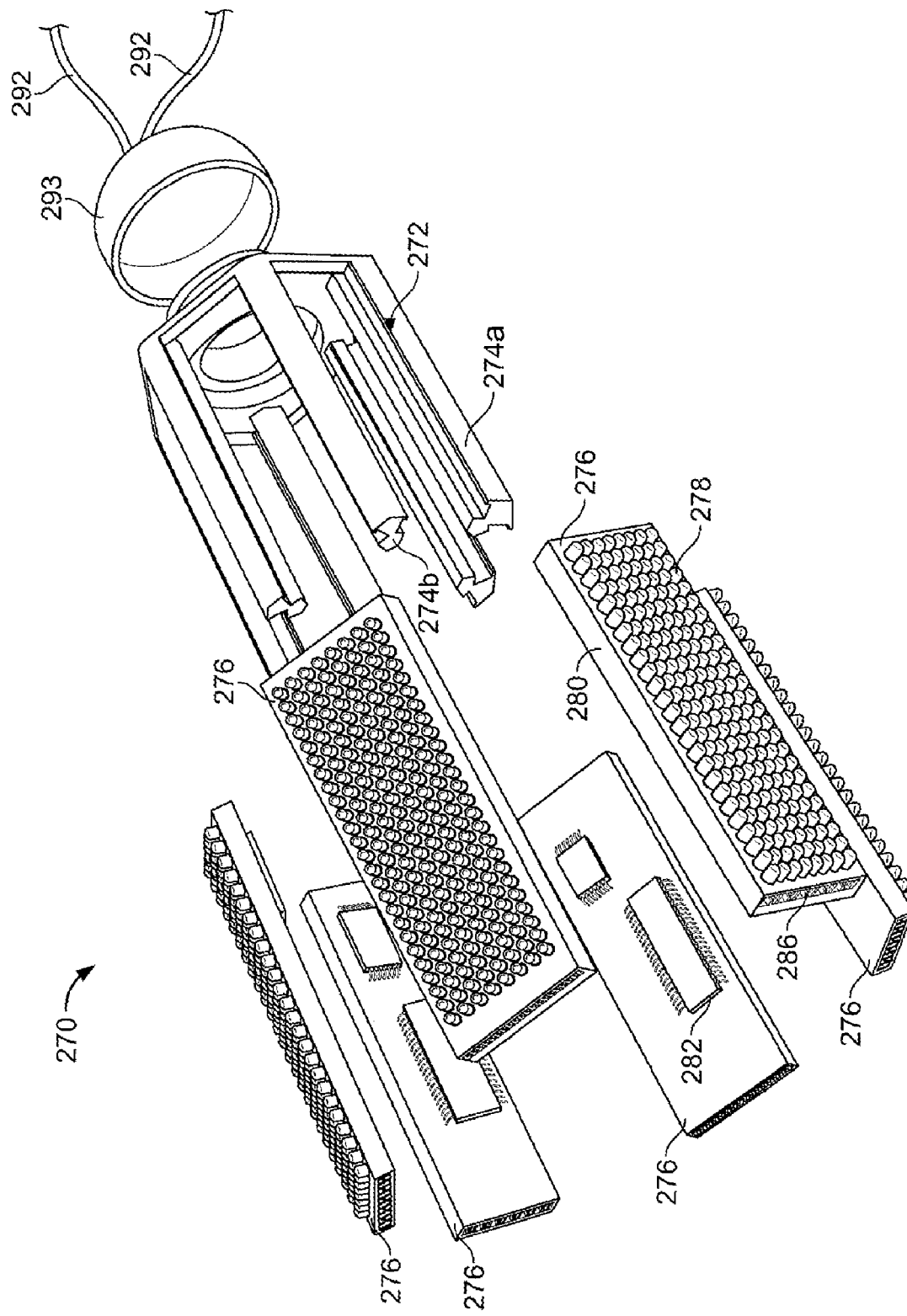
FIG. 12A is an exploded diagram of a side-emitting light source.

FIG. 12A is an exploded diagram of a side-emitting light source 270. The light source 270 can be designed to conform to standard sizes, such as the MR-16 size. The light source 270 includes a holding frame 272 for supporting six LED modules 276. Each LED module 276 includes LEDs 278 coupled to a heat exchange structure 280. In some examples, the heat exchange structure 280 is coated with a thin layer of ceramic material to increase the heat exchange efficiency. The heat exchange structure 256 has air ducts 286 (see FIG. 12B) to enhance air flow.

In the example of FIG. 12A, the holding frame 272 has six legs, such as 274a and 274b, collectively 274. The legs 274 have elongated grooves for receiving the sides of LED modules 276. For example, an LED module 276 has sides that are received by the grooves of the legs 274a and 274b. Wires 292 connect the light source 270 to an electric power source. An adapting structure 293 couples the wires 292 to signals lines (not shown) attached to the holding frame 272 for distributing the electric power to the LED modules 276.

Figure 12B:
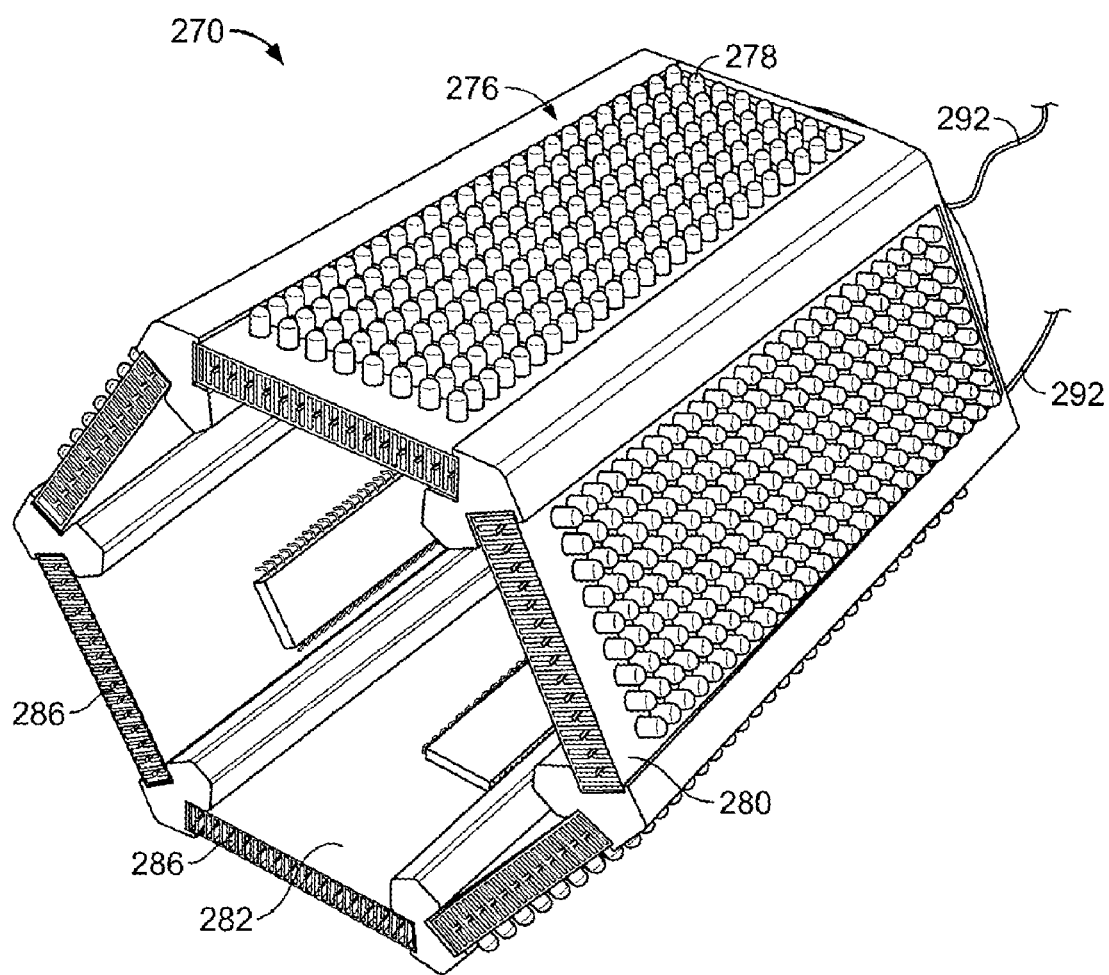
FIG. 12B is an assembled view of the light source of FIG. 12A

In each LED module 276, the LEDs 278 are mounted on a side wall of the heat exchange structure 280 facing outwards when the light source 270 is assembled (see FIG. 12B). Electronic circuit devices 282 are mounted on a side wall of the heat exchange structure 280 facing inwards when the light source 270 is assembled.

In some examples, holes can be drilled in the walls of the heat exchange structure 280 to allow cold air to enter and hot air to exit the air ducts.

FIG. 12B is an assembled view of the light source 270. The size of the light source can be different from MR-16. The light source can have, for example, three legs, four legs, eight legs, etc., to form different shapes.

Figure 13A:
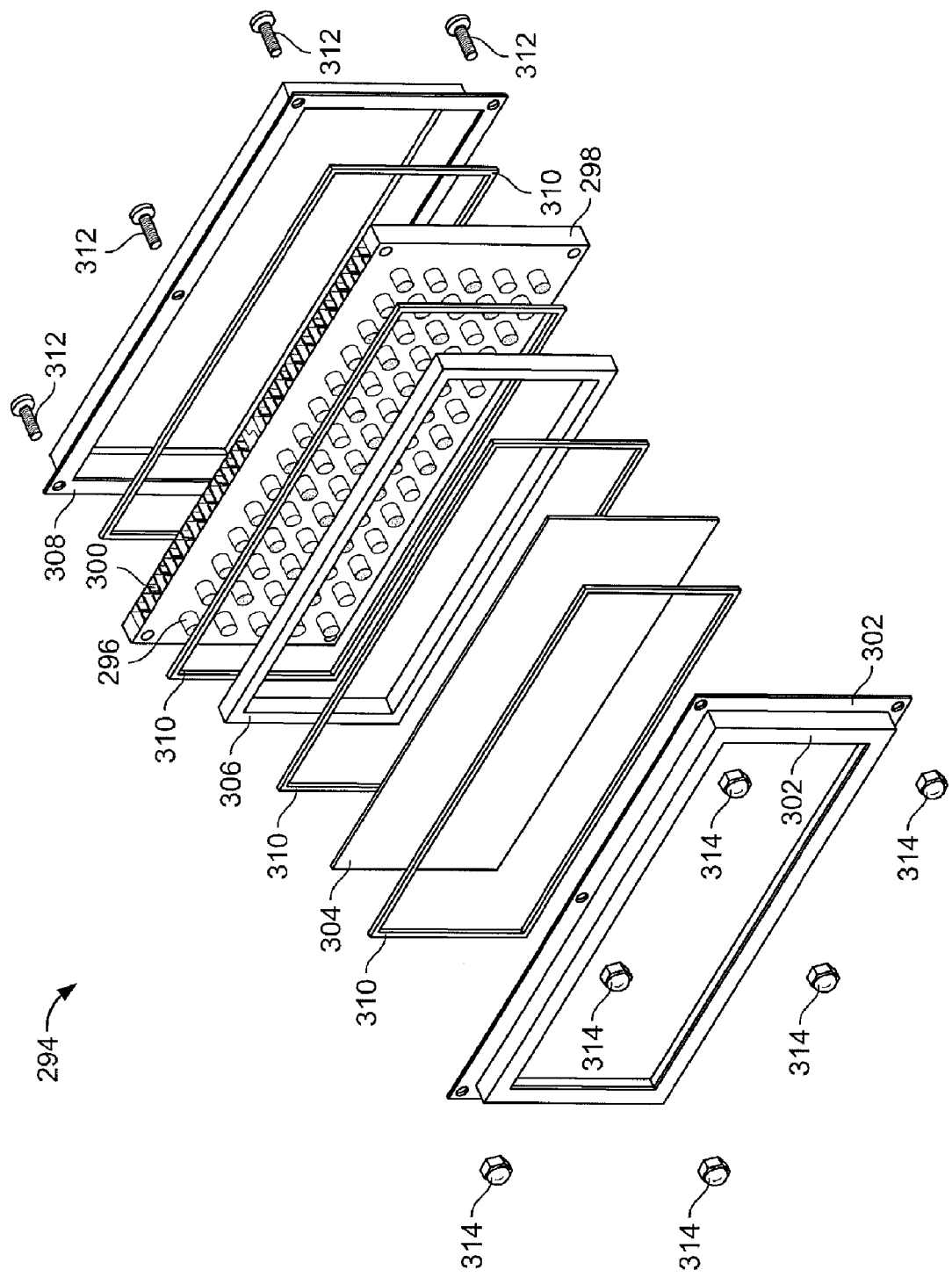
FIG. 13A is an exploded diagram of a wall wash light.

FIG. 13A is an exploded diagram of a wall wash light 294. The wall wash light 294 includes LEDs 296 that are coupled to a heat exchange structure 298. In some examples, the heat exchange structure 298 is coated with a thin layer of ceramic material to enhance the heat exchange efficiency. The heat exchange structure 298 has air ducts 300 to enhance air flow.

Figure 13B:
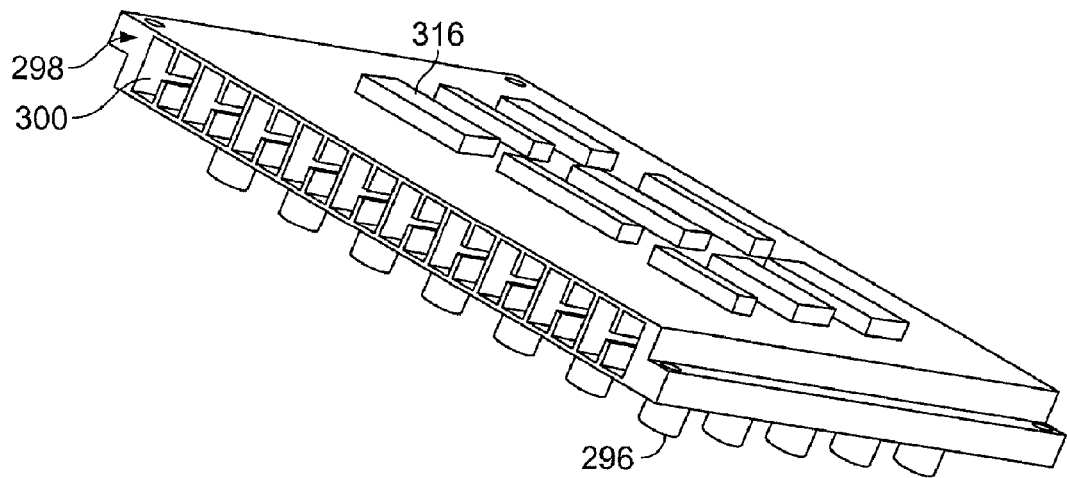
FIG. 13B shows electrical circuit devices on a heat exchange structure.

The wall wash light 294 includes a front window 302, a glass lens 304 to focus the light from the array of LEDs 296, a support 306 for supporting the glass lens 304, and a base cover 308. O-rings 310 are provided to prevent moisture and dust from entering the wall wash light 294. There are two water-tight chambers in the wall wash light 294. The front-side water-tight chamber encloses the LEDs 296, and a back-side water-tight chamber encloses a power supply and control circuits for controlling the LEDs 296. Holes are provided at the edges of the heat exchange structure 298 (where there are no air ducts) to connect the front-side chamber to the back-side chamber, to allow signal lines to connect the LEDs 296 to the power supply and control circuits. The holes for passing the signal lines only connect the two water-tight chambers, and are not connected to the air ducts 300 or to the outside ambient air. This ensures that moisture does not enter the front and back chambers. Screws 312 and nuts 314 are used to fasten the components of the wall wash light 294 together. As shown in FIG. 13B, electrical circuit devices 316 (such as the power supply and control circuits) are mounted on a side wall of the heat exchange structure 298.

Figure 13C:
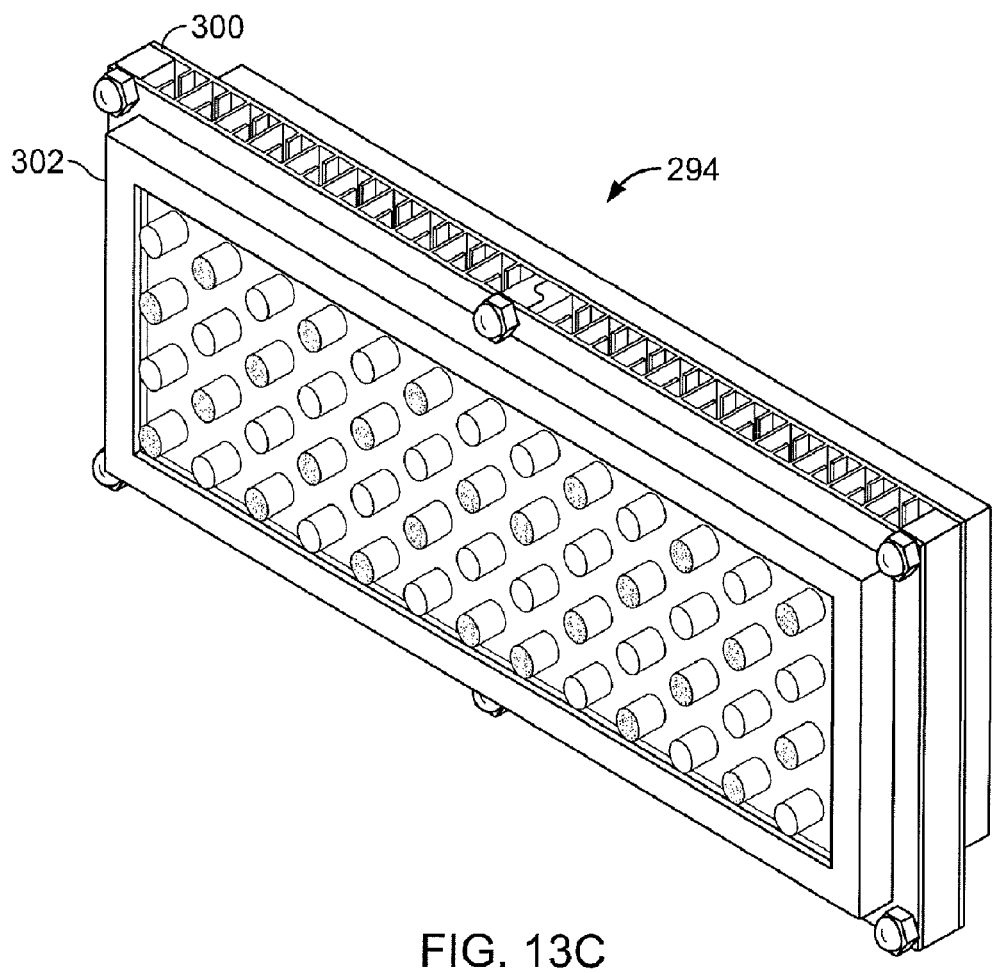
FIG. 13C is an assembled view of the wall wash light of FIG. 13A

FIG. 13C shows an assembled view of the wall wash light 294. This design has an advantage of providing a water-tight environment for the LEDs, and at the same time providing effective heat dissipation. This design can also be used in street lighting lamps.

In some application, the electrical circuit devices 316 (FIG. 13B) can be mounted on the same side as the LEDs and located in the water-tight environment, so that the electrical circuit devices 316 are protected from moisture. Various modifications can be made to these designs.

Alternative Examples

The description above uses a metal structural section as an example to describe the useful properties of a heat exchange structure coated with a thin layer of material that modifies the surface potential of the heat exchange structure. The thin coating can also be applied to other types of structural sections to enhance heat exchange efficiency.

Figure 8:
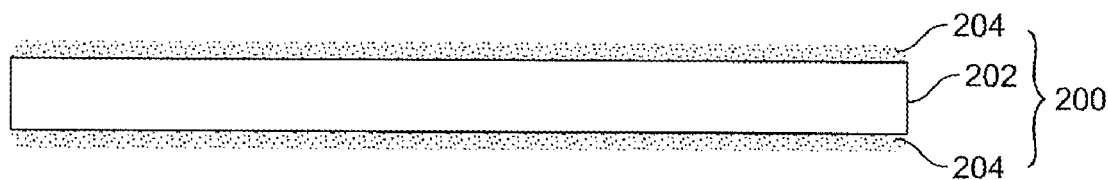
FIG. 8 shows a heat exchange structure having a ceramic structural section.

For example, referring to FIG. 8, a heat exchange structure 200 includes a ceramic structural section 202 and a thin layer of ceramic material 204 coated on each side of the structural section 202. The ceramic structural section 202 can be made of aluminum oxide, aluminum nitride, titanium oxide, titanium nitride, zirconium oxide, and zirconium nitride. The thin layers 204 can be made of silicon oxide, alumina, boron oxide, hafnium oxide, titanium oxide, titanium nitride, zirconium oxide, and zirconium nitride. The ceramic structural section 202 can have a layered structure (e.g., having layers on top of other layers) or a non-layered structure. The thin layers 204 can have spiky micro- and/or nano-structures.

Experiments were conducted using a light source including twelve one-watt LEDs that were mounted on a planar heat exchange structure 200 (FIG. 8) having a ceramic structural section. The heat exchange structure 200 has an area of 3.times.3 inch.sup.2. The heat exchange structure 200 includes a ceramic structural section 202 and a thin layer of ceramic material 204 coated on one side of the structural section 202. The structural section 202 was made of aluminum oxide ceramic, and each of the thin layers 204 was made of silicon oxide, alumina, boron oxide, and hafnium oxide. The thin layers 204 have spiky micro- and nano-structures. When all of the twelve 1-watt LEDs were turned on, in an open air environment having a temperature between about 23 to 28 degree C., without using a fan, the hottest spot on the heat exchange structure 200 had a temperature not greater than 87 degrees C.

Co-pending U.S. patent application Ser. No. 10/828,154, filed on Oct. 20, 2004, titled "Ceramic Composite," provides description of certain applications of thin coatings, for example, to provide a flat surface. The contents of U.S. patent application Ser. No. 10/828,154 are incorporated by reference.

The coating process used to coat the ceramic layers onto ceramic structural sections to generate the heat exchange structure 200 is similar to that described in U.S. patent application Ser. No. 10/828,154. The material compositions used to in the coating process can be fine tuned (e.g., by adjusting the percentages of each component material) such that the thin ceramic layer 204 has about 15% more spikes on the surface (as compared to the ceramic layer described in U.S. patent application Ser. No. 10/828,154). The coating process can be adjusted, such as varying the temperature as a function of time, so as to enhance the spiky structures.

The metal structural section 164 in FIG. 5A can be replaced by a structural section made of a composite material, such as fiber reinforced aluminum. In FIGS. 1, 3, and 4, the air ducts 102 do not necessarily have to be aligned along the same direction. For example, to reduce the overall height of the heat exchange structure 100, 130, or 140, the air ducts may be tilted at an angle relative to the vertical direction, and different air ducts may be tilted towards different directions and/or at different angles.

The heat exchange structures can be designed to be used with a particular type of gas for carrying away heat. The process for coating the thin ceramic layer 162 on the metal structural section 164 can be adjusted such that the sub-layer 168 has a porous structure that is at least partially permeable to the particular type of gas molecules.

Similarly, the heat exchange structures can be designed to be used with a particular type of liquid for carrying away heat. The process for coating the thin ceramic layer 162 on the metal structural section 164 can be adjusted such that the sub-layer 168 has a porous structure that is at least partially permeable to the particular type of liquid molecules.

In some examples, the first sub-layer 166 may have cracks or fissures that may allow gas molecules to pass. In general, the first sub-layer 166 is substantially impermeable to gas molecules relative to the second sub-layer 168.

The light sources shown in FIGS. 10A, 11A, 12A, and 13A can have different configurations, such as having different sizes and shapes. The LEDs can be replaced by other types of light emitting devices. The heat exchange structures (e.g., 228 in FIG. 10A, 254 in FIG. 11A, 276 in FIG. 12A, and 298 in FIG. 13A) can be made of a ceramic structural section that is coated with a thin layer of ceramic material. In some examples, heat pipes are incorporated to enhance the heat transport and heat dissipation. In some examples, having the air ducts is sufficient for heat dissipation, then the heat exchange structure can be made of a metal or a metal alloy. In some examples, having a thin coating of ceramic material on the heat exchange structure is sufficient for heat dissipation, and air ducts are not used.

Figure 9:
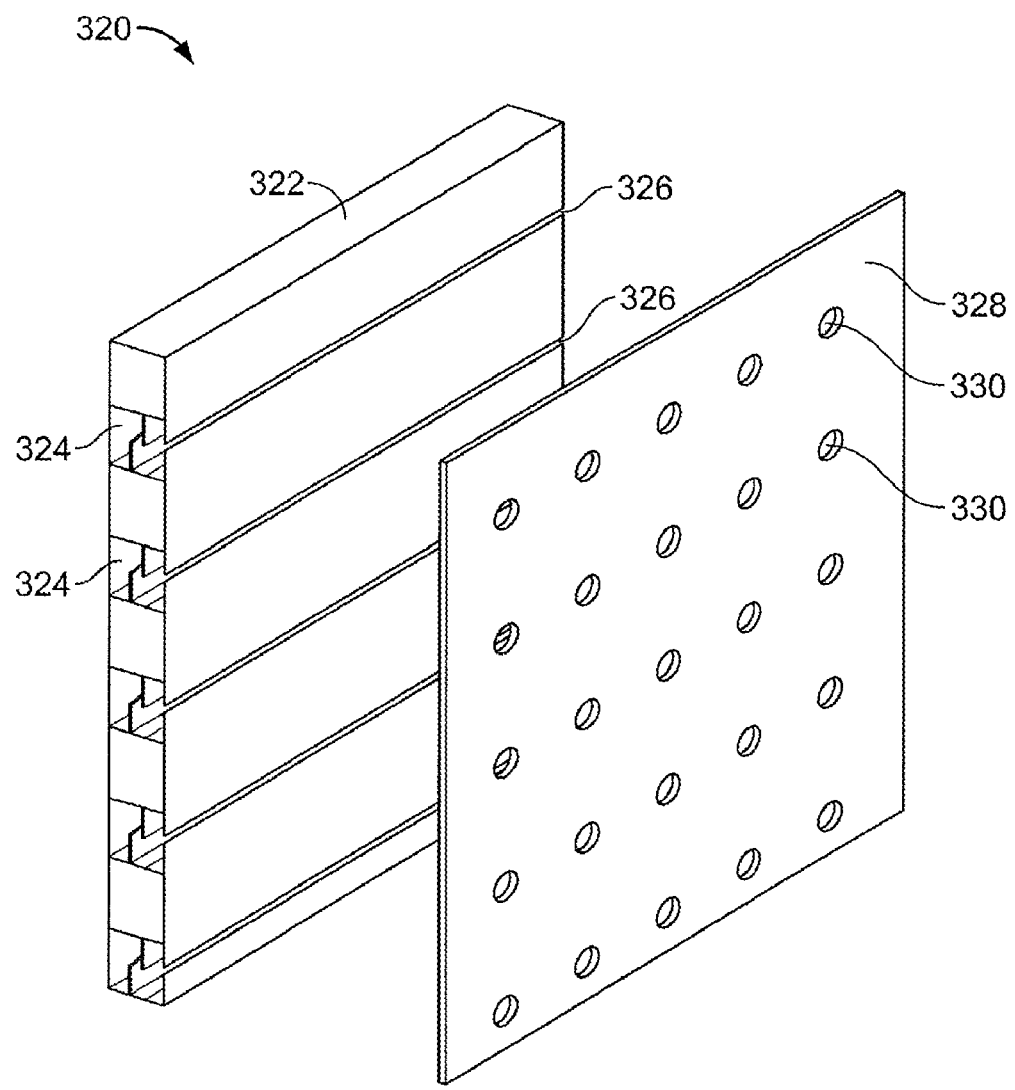
FIG. 9 is a diagram of an air duct.

Referring to FIG. 9, an example of a heat exchange structure 320 includes a heat exchange unit 322 that has air ducts 324, in which one wall of the air duct 324 has a slit 326. The heat exchange unit 322 has a structural section made of metal, such as aluminum, having a high thermal conductivity. The metal structural section is coated with a thin ceramic layer to enhance heat exchange between the heat exchange structure 320 and the ambient air. The thin ceramic layer is coated onto the metal structural section using a micro-arc-oxidation plating process. The slit 326 facilitates the process of coating the thin ceramic layer on the metal structural section. During the plating process, the slit 326 allows the chemicals for forming the thin ceramic layer to be easily coated onto the air duct walls. After the thin ceramic layer is coated to the metal structural section, a thin sheet of metal plate 328 having holes 330 is attached to the heat exchange unit 322. Cold ambient air can flow through the holes 330 and the slit 326 into the air duct 324. Similarly, hot air can flow out of the air duct 324 through the slit 326 and holes 330.

The heat exchange structure 130 of FIG. 3 can be modified such that the heat exchange unit 134 has air ducts 120, in which each air duct has a wall with a slit. A metal plate having holes can be attached to the heat exchange unit 134, similar to the example shown in FIG. 9. In this case, the heat exchange units 134 and the heat pipe 132 can be fabricated from one piece of metal by using an extrusion process, and the metal plate can be a separate piece of metal.

The air ducts do not have to be straight. The walls of the air ducts can be curved, such that the air duct follows a curved path. The cross sections of the air ducts do not have to be uniform throughout the length of the air ducts.

It is to be understood that the foregoing description is intended to illustrate and not to limit the scope of the invention, which is defined by the scope of the appended claims. Other examples are within the scope of the following claims.

What is claimed is:

1. A method comprising:
   transferring thermal energy from a plurality of heat generators to multiple locations of an interior heat exchange surface of a heat exchange structure, the interior heat exchange surface being in an air duct of the heat exchange structure, the heat generators being coupled to an exterior heat exchange surface of the heat exchange structure and disposed along an elongated direction of the air duct; and
   heating air in the air duct successively by transferring thermal energy from the multiple locations of the interior heat exchange surface to the air as the air flows through the air duct, enhancing air flow in the air duct by buoyancy of heated air;
   wherein heating the air in the air duct further comprises:
   transferring thermal energy from the multiple locations of the interior heat exchange surface to an air-impermeable first surface of a thin layer of ceramic material formed on the heat exchange structure;
   transferring thermal energy through the thin layer of ceramic material from the air-impermeable first surface of the thin layer of ceramic material to a porous second surface of the thin layer of ceramic material;
   heating air molecules trapped in pores of the porous second surface of the thin layer of ceramic material; and
   transferring thermal energy from the thin layer of ceramic material to air in the air duct by moving the air molecules from the pores of the porous second surface of the thin layer of ceramic material to the air flowing in the air duct.

2. The method of claim 1 wherein transferring thermal energy from the heat generators to the interior heat exchange surface comprises transferring thermal energy through a wall separating the exterior heat exchange surface and the interior heat exchange surface, the wall having a thickness less than 5 mm.

3. The method of claim 1 wherein transferring heat from the heat generators to the multiple locations comprises transferring heat from electronic devices to the multiple locations.

4. A method comprising:
   transferring thermal energy from a heat generator to a heat pipe;
   transferring thermal energy from different portions of the heat pipe to a heat exchange structure that comprises a plurality of elongated air ducts, the different portions of the heat pipe aligned along an elongated direction of the air ducts; and
   heating the air in the air ducts successively by transferring thermal energy from the different portions of the heat pipe to the air flowing in the air ducts, enhancing air flow in the air ducts by buoyancy of heated air;
   wherein heating the air in the air ducts further comprises:
   transferring thermal energy from the heat pipe to an air-impermeable first surface of a thin layer of ceramic material formed on the heat exchange structure;
   transferring thermal energy through the thin layer of ceramic material from the air-impermeable first surface of the thin layer of ceramic material to a porous second surface of the thin layer of ceramic material;
   heating air molecules trapped in pores of the porous second surface of the thin layer of ceramic material; and
   transferring thermal energy from the thin layer of ceramic material to air in the air ducts by moving the air molecules from the pores of the porous second surface of the thin layer of ceramic material to the air flowing in the air ducts.

5. A method comprising:

mounting an array of heat generators on an exterior heat exchange surface of a heat exchange structure, the heat exchange structure comprising elongated air ducts, the array of heat generators comprising groups of heat generators, each group having heat generators mounted along an elongated direction of the air ducts, the heat exchange structure comprising interior heat exchange surfaces being in the elongated air ducts, the interior heat exchange surfaces configured to successively heat air in the air ducts by transferring heat from the array of heat generators to the air flowing in the air ducts and enhancing air flow in the air ducts due to buoyancy of heated air;

coating the interior heat exchange surfaces in the elongated air ducts with a thin layer of ceramic material;

wherein coating the interior heat exchange surfaces further comprises initially coating the interior heat exchange surfaces with a first sub-layer and finally coating the interior heat exchange surfaces with a second sub-layer;

wherein the thin layer of ceramic material is configured to be air impermeable at a first surface of the first sub-layer which attaches to the interior heat exchange surfaces, and porous at a second surface of the second sub-layer, the second surface being opposed to the first surface and exposed to the air flow in the air ducts.

6. The method of claim 5 in which mounting the array of heat generators comprises mounting an array of light sources.

* * * * *